United States Patent
Lu et al.

(10) Patent No.: US 12,270,778 B2
(45) Date of Patent: Apr. 8, 2025

(54) FULL-SCALE DYNAMIC DETECTION OF BACTERIAL BIOFILM FORMATION USING MGZNO NANOSTRUCTURE MODIFIED MULTIFUNCTIONAL SENSORS

(71) Applicant: Rutgers, The State University of New Jersey, New Brunswick, NJ (US)

(72) Inventors: Yicheng Lu, East Brunswick, NJ (US); Pavel I. Reyes, New York, NY (US); Guangyuan Li, Piscataway, NJ (US); Yifan Wu, Highland Park, NJ (US); Xilin Zhao, Livingston, NJ (US)

(73) Assignee: RUTGERS, THE STATE UNIVERSITY OF NEW JERSEY, New Brunswick, NJ (US)

( * ) Notice: Subject to any disclaimer, the term of this patent is extended or adjusted under 35 U.S.C. 154(b) by 1140 days.

(21) Appl. No.: 17/247,838

(22) Filed: Dec. 24, 2020

(65) Prior Publication Data
US 2021/0190717 A1  Jun. 24, 2021

Related U.S. Application Data

(60) Provisional application No. 62/953,344, filed on Dec. 24, 2019, provisional application No. 62/953,333, filed on Dec. 24, 2019.

(51) Int. Cl.
*G01N 27/27* (2006.01)
*G01N 27/414* (2006.01)
(Continued)

(52) U.S. Cl.
CPC ......... *G01N 27/27* (2013.01); *G01N 27/4145* (2013.01); *G01N 27/4146* (2013.01);
(Continued)

(58) Field of Classification Search
CPC .............. G01N 27/27; G01N 27/4145; G01N 27/4146; G01N 29/04; G01N 29/2443;
(Continued)

(56) References Cited

U.S. PATENT DOCUMENTS

| 5,266,515 A | 11/1993 | Robb et al. |
| 9,958,443 B2 | 5/2018 | Lin et al. |

(Continued)

FOREIGN PATENT DOCUMENTS

WO   2016085126 A1   6/2016

OTHER PUBLICATIONS

Rasheed, et al: "A Wearable Autonomous Heart Rate Sensor Based on Piezoelectric-Charge-Gated Thin-Film Transistor for Continuous Multi-Point Monitoring", IEEE Xplore, 2017, 978-1-5090-2809-2/17, pp. 3281-3284 (Year: 2017).*
(Continued)

*Primary Examiner* — Donald H B Braswell
*Assistant Examiner* — Sesha Sairaman Srinivasan
(74) *Attorney, Agent, or Firm* — FOX ROTHSCHILD LLP

(57) ABSTRACT

This document discloses a hybrid and multifunctional biosensing technology consisting of a dual gate thin-film transistor (DGTFT) biosensor with an extended gate covered with magnesium zinc oxide nanostructures ($MZO_{nano}$) and an $MZO_{nano}$ modified bulk acoustic wave resonator ($MZO_{nano}$ BAW). The technology is used for the full-scale dynamic monitoring of bacterial biofilm formation from its early stage to the maturation stage.

20 Claims, 13 Drawing Sheets

(51) Int. Cl.
   *G01N 29/02*    (2006.01)
   *G01N 29/036*   (2006.01)
   *G01N 29/04*    (2006.01)
   *G01N 29/24*    (2006.01)
   *H10D 30/67*    (2025.01)
   *H10D 62/10*    (2025.01)
   *H10N 30/30*    (2023.01)

(52) U.S. Cl.
   CPC ......... *G01N 29/04* (2013.01); *G01N 29/2443* (2013.01); *H10D 30/6734* (2025.01); *H10D 30/6755* (2025.01); *H10D 62/118* (2025.01); *H10N 30/302* (2023.02); *G01N 2291/023* (2013.01)

(58) Field of Classification Search
   CPC ..... G01N 2291/023; G01N 2291/0255; G01N 2291/0256; G01N 2291/0426; G01N 29/022; G01N 29/036; H01L 29/0665; H01L 29/78648; H01L 29/7869; H10N 30/302; H10N 30/85
   See application file for complete search history.

(56) References Cited

U.S. PATENT DOCUMENTS

| | | | | |
|---|---|---|---|---|
| 2007/0210349 | A1* | 9/2007 | Lu | C12Q 1/6837 257/252 |
| 2011/0114938 | A1* | 5/2011 | Nakahara | B65D 83/775 257/43 |
| 2014/0291669 | A1* | 10/2014 | Ji | H01L 29/4908 257/43 |
| 2014/0364325 | A1* | 12/2014 | Cable | G01N 29/2406 506/17 |
| 2017/0082570 | A1* | 3/2017 | Takechi | G01N 27/4145 |
| 2018/0209836 | A1* | 7/2018 | Lu | C12M 1/34 |
| 2019/0137443 | A1* | 5/2019 | Balijepalli | B01L 3/502715 |

OTHER PUBLICATIONS

Chae, et al: "IGZO-Baed Electrolyte-Gated Field-Effect Transistor for in situ Biological Sensing Platform", Sensors and Actuators B, 2018, vol. 262, , pp. 876-883.

Chen, et al: "Towards Real-Time Observation of Conditioning Film and Early Biofilm Formation Under Laminar Flow Conditions Using a Quartz Crystal Microbalance", Biochemical Engineering Journal, 2010, vol. 53, pp. 121-130.

Kim, et al: "An ALD Aluminum Oxide Passivated Surface Acoustic Wave Sensor for Early Biofilm Detection", Sensors and Actuators B, 2012, vol. 163, pp. 136-145.

Kim, et al: "A Surface Acoustic Wave Biofilm Sensor Integrated with a Treatment Method Based on the Bioelectric Effect", Sensors and Actuators A, 2016, vol. 238, pp. 140-149.

Lee, et al: "A Self-Amplified Transistor Immunosensor Under Dual Gate Operation: Highly Sensitive Detection of Hepatitis B Surface Antigen", Nanoscale, 2015, 7, pp. 16789-16797.

Paredes, et al: "Label-Free Interdigitated Microelectrode Based Biosensors for Bacterial Biofilm Growth Monitoring Using Petri Dishes", Journal of Microbiological Methods, 2014, vol. 100, pp. 77-83.

Paredes, et al: "Interdigitated Microelectrode Biosensor for Bacterial Biofilm Growth Monitoring by Impedance Spectroscopy Technique in 96-Well Microtiter Plates", Sensors and Actuators B, 2013, vol. 178, pp. 663-670.

Paredes, et al: "Real Time Monitoring of the Impedance Characteristics of Staphylococcal Bacterial Biofilm Cultures with a Modified CDC Reactor System", Biosensors and Bioelectronics, 2012, vol. 38, pp. 226-232.

Spijkman, Mark-Jan: "Dual-Gate Thin-Film Trasistors for Logic and Sensors"; University of Groningen, 2011.

Wu et al: "Investigation of Streptavidiin-Ligand Biochemical Interactions by IGZO Thin Film Transistors Integrated with Microfluidic Channels", Sensors and Actuators B, 2018, vol. 262, pp. 418-424.

* cited by examiner

FULL-SCALE DYNAMIC DETECTION OF BACTERIAL BIOFILM FORMATION USING MGZNO NANOSTRUCTURE MODIFIED MULTIFUNCTIONAL SENSORS

CROSS-REFERENCE TO RELATED APPLICATIONS

This application claims the benefit of priority to U.S. Provisional Patent Application No. 62/953,333 filed Dec. 24, 2019 and 62/953,344 also filed Dec. 24, 2019, the disclosures of which are hereby incorporated by reference in their entireties.

TECHNICAL FIELD

This patent document relates to a multifunctional biosensing technology consisting of a combination of an extended-gate type MgZnO dual gate thin film transistor (MZO DGTFT) and a bulk acoustic wave (BAW) sensor, both sensing surfaces modified with MZO nanostructures ($MZO_{nano}$), working in tandem for the full-scale dynamic detection of bacterial biofilm formation.

BACKGROUND

The worldwide industry for biomedical devices, which includes medical indwelling implants, is growing rapidly in the past few decades and has reached $300 billion per year in market share. However, the medical implant industry is being limited by patient tissue rejection and incompatibility due to microbial infections from biofilm formation. In the United States alone, every year approximately 1 million device-associated infections happen due to the bacterial adhesion and the subsequent biofilm formation, which costs the healthcare system an additional medical expense of over $5 billion. Although aseptic and sterilization precautions are used, indwelling devices present suitable conditions for free floating bacteria to attach to their surfaces. As the division of bacterial cells and the production of extracellular polymeric substances (EPSs), bacterial microcolonies form at the sites of infection and eventually become matured biofilms. EPS houses the microbes and offers a unique biochemical environment for them. Once biofilms are established, conventional antibiotics therapies are largely ineffective since biofilms are characterized to show from 500 to 5,000 times more tolerant to antibiotic agents than free-floating bacteria of the same kind. This is partly because the EPS acts as a protecting layer against the diffusion of antibiotic agents.

Conventional approaches such as phase-contrast microscopy, confocal laser scanning microscopy (CLSM), and biofilm disruption methods combined with staining assays have been employed to visualize and detect bacterial cells and biofilms. However, these conventional methods are highly labor intensive and very slow. To minimize or even prevent the bacterial infection on medical indwelling devices, a need has emerged for high-throughput analysis and techniques that allow for the detection and monitoring of the biofilm development in real time. At the early stage of biofilm formation when bacterial cells are not encapsulated in EPS yet, antimicrobial agents are still effective to kill the bacteria. Therefore, the sooner an infection is detected, the more effective the treatment will be. Thus, the development of an early stage biofilm detection method with high sensitivity and fast response is very critical for timely clinical treatment of biofilms. In addition, once the development of biofilm formation passes the early stage, its growth kinetic profile should also be monitored during the long-term process, because such information can serve as a feedback signal for future medical treatments.

SUMMARY OF THE INVENTION

The technology disclosed in this patent document meets such a need. Biofilm formation involves three stages: (i) bacterial adhesion (early stage), (ii) bacterial expansion (growth stage), and (iii) biofilm maturation (final stage). This invention is a hybrid and multifunctional biosensing technology that is used to dynamically monitor the full-scale development of bacterial biofilm formation from early stage to final stage. This novel technology comprises of a combination of two types of sensing devices that are integrated with the same $MZO_{nano}$ as the sensing surface, for the multifunctional sensing: (1) electrical testing: the MZO DGTFT with an $MZO_{nano}$ modified extended sensing pad to monitor the early stage biofilm formation through the electrical charge transfer mechanism, and (2) acoustic testing: the $MZO_{nano}$ BAW to monitor the growth and final stages of biofilm development, through mass accumulation and viscoelastic transitions in the bacterial culture.

The biosensing system for dynamically detecting biofilm formation and its development includes:
a dual gate thin-film transistor (DGTFT) biosensor and a bulk acoustic wave (BAW) sensor, where the DGTFT biosensor comprising
(a) a DGTFT transducer, comprising
a first substrate;
a bottom biasing gate deposited on the first substrate;
a bottom dielectric layer deposited on a top surface of the bottom biasing gate;
a channel layer comprising semiconducting MgxZn1-xO deposited on a top surface of the bottom dielectric layer, wherein $0 < x \leq 0.06$;
a top gate dielectric layer deposited on the channel layer;
a top sensing gate deposited on the top gate dielectric layer; and
a drain electrode and a source electrode each electrically connected to the channel layer; and
(b) a sensing pad receptor, comprising
a second substrate;
an electrode layer deposited and patterned with different dimensions on the second substrate;
a sensing pad nanostructure layer deposited and patterned on the electrode layer, wherein the sensing pad nanostructure layer comprises MgyZn1-yO, wherein $0 \leq y \leq 0.1$;
and wherein the BAW sensor is quartz crystal microbalance (QCM) or thin film bulk acoustic wave resonator (TFBAR);
wherein the QCM comprises:
a quartz crystal piezoelectric layer;
a first bottom electrode deposited and patterned on a bottom surface of the piezoelectric layer;
a first top electrode deposited and patterned on a top surface of the piezoelectrode layer;
a QCM nanostructure layer, wherein the QCM nanostructure layer comprises MgyZn1-yO,
wherein y is as defined above;
wherein the TFBAR comprises:
a third substrate;
a second bottom electrode deposited and patterned on the third substrate;
a piezoelectric film;

a second top electrode deposited and patterned on a top surface of the piezoelectrode film;

a TFBAR nanostructure layer deposited and patterned on the top electrode surface, wherein the TFBAR nanostructure layer comprises $Mg_yZn_{1-y}O$, wherein y is as defined above.

The four terminals (bottom biasing gate, top sensing gate, source electrode and drain electrode) of the DGTFT, the electrodes on the extended sensing pad of DGTFT, and the electrodes of the BAW device are made of conducting materials. The substrates for constructing both DGTFT and BAW may include rigid materials such as glass and ceramics, or flexible materials such as polymer.

Sensing areas of both the DGTFT sensor and the BAW sensor utilize $MZO_{nano}$ modification layer to enhance the devices' sensitivities and biocompatibilities. The $MZO_{nano}$ material deposition can be accomplished in a single process.

The $MZO_{nano}$ on the sensing area of the DGTFT sensor and the BAW sensor enables enhanced biosensing ability due to the increased effective sensing area. The sensitivity of the biosensor is greatly enhanced through the control and optimization of (i) surface wettability of the $MZO_{nano}$, and fine-tuning of Mg levels in the composition for (ii) surface morphology, (iii) toxicity reduction and (iv) larger pH tolerance range of the $MZO_{nano}$.

The DGTFT configurations have the following unique advantages: (i) High sensitivity from its high signal gain, which only requires significantly low concentrations of microbial samples to register an output signal. (ii) Flexible operation points of the DGTFT, which allows for the selection from multiple regions of signal capturing for enhanced signal processing and therefore, high sensitivity and stable operations. (iii) Isolation the DGTFT from harsh biochemical environment using extended sensing gate design, hence the active device is not perturbed by the sample which provides measurement stability and repeatability. (iv) Replaceable and disposable sensing pad features enabled by the extended sending gate design, also leading to the advantages of high throughput, stable operation, and quantitative analysis. (v) Low fabrication cost.

To suppress the Zn diffusion from the channel layer to the dielectric layers, the DGTFT transducer can include a barrier layer comprising MgO between the channel layer and the bottom gate dielectric layer and/or between the channel layer and the top dielectric layer.

The trade-off between large signal variation (therefore high sensitivity) and stable operation (therefore small standard deviation) is obtained through adjusting the bottom biasing voltage of the DGTFT.

The first-order derivative of the drain current variations is taken as a function of bacterial biofilm incubation time, showing a declining rate of bacterial charge transfer.

An $MZO_{nano}$ BAW sensor device for monitoring the long-term process of biofilm development includes a piezoelectric layer with a top and a bottom metallic or transparent conductive electrode patterned on both side of the piezoelectric layer. The sensor includes the same $MZO_{nano}$ layer as on the sensing pad of the DGTFT biosensor deposited and patterned on the top electrode of the sensor device.

The $MZO_{nano}$ BAW sensor device may either be a quartz crystal microbalance (QCM) sensor or a thin film bulk acoustic wave resonator (TFBAR) sensor. In some embodiments, the $MZO_{nano}$ BAW sensor is QCM-based ($MZO_{nano}$ QCM), in which the transducer device is a QCM and the $MZO_{nano}$ are deposited on the surface of the top electrode of the QCM to function as the sensing surface. In some embodiments, the $MZO_{nano}$ BAW is TFBAR-based ($MZO_{nano}$ TFBAR), in which the transducer device is a TFBAR and the $MZO_{nano}$ is deposited on the surface of its top electrode to function as the sensing surface.

The TFBAR is an effective way to achieve miniaturization to chip level of the $MZO_{nano}$ QCM for the achievement of a plug-in-card type sensing pad. Such design contains a disposable sensing pad ($MZO_{nano}$ sensing array+$MZO_{nano}$ TFBAR array) and a reusable circuit pad (DGTFT+memory component+data processing component). The miniaturized integrated system provides the advantages of high throughput and low-cost properties.

Another aspect provides a kit including the biosensor disclosed herein.

Another aspect provides a method of detecting one or more stages of biofilm formation in a sample, comprising contacting the sample with the sensing pad nanostructure layer and one of the QCM nanostructure layer and the TFBAR nanostructure layer of the biosensor system disclosed herein, wherein bacterial adhesion state is detected at the sensing pad nanostructure layer via electrical signal extraction, and wherein bacterial expansion stage and biofilm maturation stage are detected at the the QCM nanostructure layer or the TFBAR nanostructure layer via acoustic signal extraction.

After the early stage of biofilm formation, the MZO DGTFT is saturated in current variations. Then, the $MZO_{nano}$ BAW is used for long-term dynamic monitoring of the biofilm development during the growth and final stages to overcome the shortcoming of the long-term monitoring capability of DGTFT. The viscoelastic transitions and mass accumulation are dynamically measured in real-time through the $MZO_{nano}$ BAW sensor's time-evolving acoustic wave spectral signals.

This complementary biosensing technology can dynamically detect the details of the biofilm formation process, ranging from the bacterial adhesion stage (early stage) to the maturation stage (final stage). In clinical applications, such a hybrid technology would benefit the in-vitro study of biofilm formation on implantable devices and help medical professionals to promptly treat patients with effective therapies.

DETAILED DESCRIPTION

Figure 1:
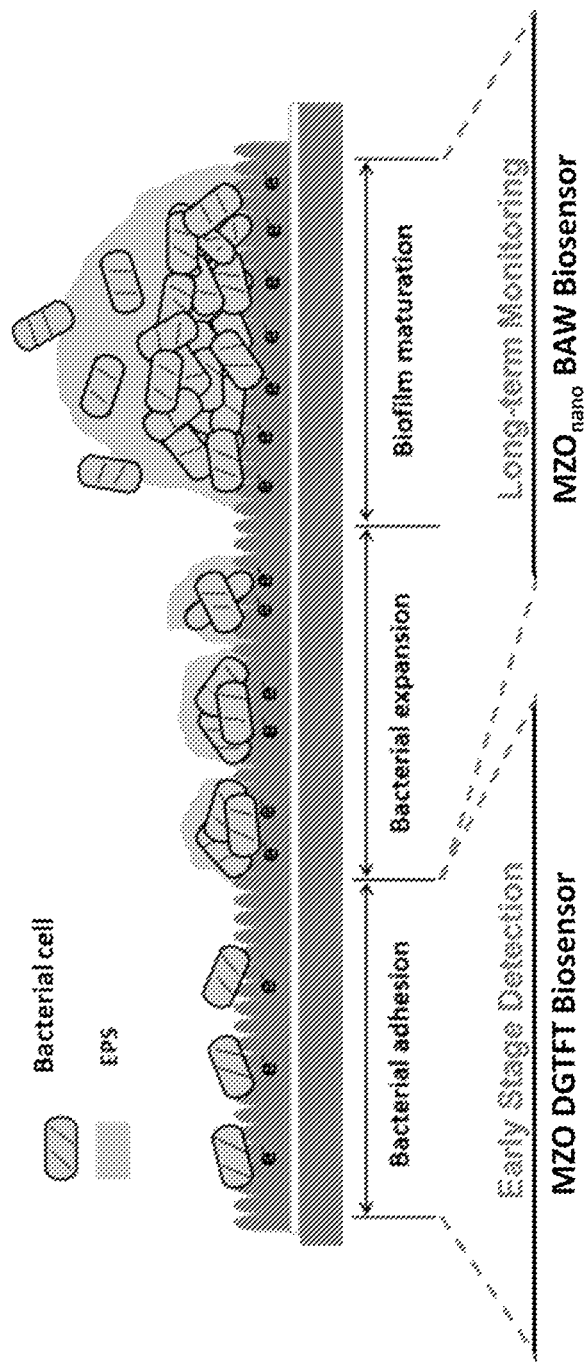
FIG. 1 shows the development process of biofilms on the nanostructure modified surface in three steps: 1) bacterial adhesion (early stage), 2) bacterial expansion (growth stage), and 3) biofilm maturation (final stage). The early stage formation of biofilms is detected by the MZO DGTFT biosensor; whereas the subsequent stages are detected in the long run by the $MZO_{nano}$ BAW.

As shown in FIG. 1, this patent document discloses a hybrid sensing technology for the full-scale dynamic monitoring of bacterial biofilm formation including (1) bacterial adhesion (early stage); (2) bacterial expansion (growth stage); and (3) biofilm maturation (final stage). This complementary biosensing technology consists of an MZO DGTFT biosensor and an MZO$_{nano}$ BAW sensor device. Both devices utilize the same MZO$_{nano}$ as the sensing surface to enhance their sensitivities and biocompabilities. MZO$_{nano}$ QCM is an embodiment of the MZO$_{nano}$ BAW sensor device. The MZO DGTFT biosensor (utilizing the electrical charge transfer from the adhesion process) emphasizes on the early stage detection and the MZO$_{nano}$ QCM (measuring the mass accumulation and viscoelastic transition) monitors the long-term kinetic growth profile of the subsequent biofilm formation process.

Bacteria can grow on living or inert surfaces along with a self-produced protective layer (EPS, extracellular polymeric substance) composed of proteins, DNA and polysaccharides, leading to the formation of biofilms. Biofilms formed on implanted medical devices can lead to difficult-to-treat bacterial infections, which may require hospitalization and prolonged treatment with antibiotics. Biofilm may also form on food and contaminate food industry infrastructures, and many other industrial infrastructures that contain drainage pipes. The protective layer blocks the diffusion of antibiotics into the biofilm, causing reduced efficacy of antibiotic treatment.

Charge transfer between bacterial cell surface and the (semi)conducting substratum surface plays an important role in the initial bacterial adhesion stage and hence influences the subsequent biofilm development process. Bacterial cell surfaces consist of a variety of different macromolecules including proteins, which contain electrochemical active groups; particularly carboxylate functions that facilitate charge transfer. During adhesion, substratum free electrons are also present which give rise to short-range electrochemical interactions with the adhering microorganisms. The charge transfer phenomenon happening during the initial bacterial adhesion stage provides an important perspective on detecting the biofilm formation at the very early stage, as the bacterial adhesion indicates the onset of biofilm formation. Therefore, one does not have to wait until the biofilm ultimately forms. Instead, the biofilm development at the early stage can be decisively predicted by detecting the charge transfer effect using electrochemical sensors with high sensitivity such as the MZO DGTFT biosensor presented here.

Early stage detection of biofilm formation is an important aspect of microbial research because once formed, biofilms show serious tolerance to antibiotics in contrast to the free-floating bacteria, which significantly increases the difficulty for clinical treatment of bacterial infections. The early stage detection technology is desired to improve the efficiency of medical treatments. The MZO DGTFT biosensor disclosed in this patent document includes an MZO DGTFT as the actuator and a ZnO$_{nano}$ or MZO$_{nano}$ array coated conducting pad as the extended sensing gate. This biosensor is for the early stage detection of biofilm formation. Charge transfer occurs between microbial cells and the nanostructure array during the initial bacterial adhesion stage. Such electrical signals, which represent the onset of biofilm formation, are dynamically detected by the DGTFT.

The MZO DGTFT biosensor features an extended sensing gate design that is to separate the MZO DGTFT from the $MZO_{nano}$ modified sensing pad where bacterial incubation occurs. Therefore, the bacterial sample is not directly in contact with the active layer of the transistor (channel), hence the active device is not perturbed by the sample which provides measurement stability and repeatability. In addition, different sensing pads according to the detection tasks can be connected to the transducer sequentially, which fuels the realization of a plug-in-card type of biosensor. The separated sensing pad can also be freely modified based on specific biomolecules to achieve high sensitivity. The DGTFT transducer is reusable and the extended sensing pad is disposable.

Compared to previously reported sensors such as the mass-based sensors, the MZO DGTFT offers high sensitivity to provide more details during the early bacterial adhesion stage; thus, enables to predict the subsequent biofilm formation. In terms of the impedance spectroscopy, the MZO DGTFT transducer intrinsically has high gain due to the transistor, which requires significantly lower number of bacterial cells to register a signal, and hence provide a high sensitivity for early detection of biofilm formation.

EPS starts to accumulate during the growth stage of biofilm development and once the biofilms formed, antibiotics treatment becomes largely ineffective. It is thus crucial to detect the long-term process of biofilm formation where the antimicrobial resistance (AMR) effect gradually shows up.

The $MZO_{nano}$ BAW biosensor is used in addition to the DGTFT biosensor to provide a long-term monitoring capability. The long-term development status of biofilm formation is dynamically recorded by measuring the viscoelastic transitions and mass accumulation in real-time through the sensor's time-evolving spectral signals.

The same $MZO_{nano}$ modification layer is grown on both the extended sensing pad of MZO DGTFT biosensor and the sensing area of BAW, serving as biomolecules interface via fine-tuning of Mg levels in the $MZO_{nano}$, surface functionalization and the sensitivity-enhancing layer resulting from the controlled morphology and wettability. The $MZO_{nano}$ deposition is accomplished in a single fabrication process.

By adopting such complementary biosensing technology, all details of the biofilm formation process can be revealed, ranging from early bacterial adhesion stage to final maturation stage. In clinical applications, such hybrid technology would benefit the in-vitro study of biofilm formation on implantable devices and help medical professionals to promptly treat patients with effective therapies.

While the following text may reference or exemplify specific embodiments of a sensor or a method of using the sensor, it is not intended to limit the scope of the device or method to such particular reference or examples. Various modifications may be made by those skilled in the art, in view of practical and economic considerations, such as the components and configurations of the sensor and the target microcolonies to be detected.

The articles "a" and "an" as used herein refers to "one or more" or "at least one," unless otherwise indicated. That is, reference to any element or component of an embodiment by the indefinite article "a" or "an" does not exclude the possibility that more than one element or component is present.

The term "bacterial adhesion" as used herein refers to the initial stage of biofilm formation. For instance, planktonic bacterial cells attach at the site of infection during this stage with little or no accumulation of EPS.

The terms "bacterial expansion" and "biofilm maturation" refer to later stages of biofilm formation. During the bacterial expansion (growth) stage, the bacterial population expands through cell division and EPS production. During the biofilm maturation (final) stage, bacterial microcolonies form at the attachment or infection site and eventually become matured biofilms.

An aspect of this patent document provides a biosensor system for detecting the early stage or full-scale development of biofilm formation. The biosensor system includes a dual gate thin-film transistor (DGTFT) biosensor and optionally a bulk acoustic wave (BAW) sensor. The DGTFT biosensor includes (a) a DGTFT transducer, comprising
 a first substrate;
 a bottom biasing gate deposited on the first substrate;
 a bottom dielectric layer deposited on a top surface of the bottom biasing gate;
 a channel layer comprising semiconducting $Mg_xZn_{1-x}O$ deposited on a top surface of the bottom dielectric layer, wherein $0<x\leq0.06$;
 a top gate dielectric layer deposited on the channel layer;
 a top sensing gate deposited on the top gate dielectric layer; and
 a drain electrode and a source electrode each electrically connected to the channel layer; and (b) a sensing pad receptor, comprising
 a second substrate;
 an electrode layer deposited and patterned with different dimensions on the second substrate; a sensing pad nanostructure layer deposited and patterned on the electrode layer, wherein the sensing pad nanostructure layer comprises $Mg_yZn_{1-y}O$, wherein $0\leq y\leq0.1$.

The BAW sensor is quartz crystal microbalance (QCM) or thin film bulk acoustic wave resonator (TFBAR);
 wherein the QCM comprises:
 a quartz crystal piezoelectric layer;
 a first bottom electrode deposited and patterned on a bottom surface of the piezoelectric layer;
 a first top electrode deposited and patterned on a top surface of the piezoelectrode layer;
 a QCM nanostructure layer, wherein the QCM nanostructure layer comprises $Mg_yZn_{1-y}O$,
 wherein y is as defined above;
 wherein the TFBAR comprises:
 a third substrate;
 a second bottom electrode deposited and patterned on the third substrate;
 a piezoelectric film;
 a second top electrode deposited and patterned on a top surface of the piezoelectrode film;
 a TFBAR nanostructure layer deposited and patterned on the top electrode surface, wherein the TFBAR nanostructure layer comprises $Mg_yZn_{1-y}O$, wherein y is as defined above.

In some embodiments, the biosensor system includes both the DGTFT biosensor and the BAW sensor for full scale detection of biofilm formation from bacterial adhesion stage to bacterial expansion stage and biofilm maturation stage. In some embodiments, the biosensor system includes only the DGTFT biosensor for detection of bacterial adhesion.

In exemplary embodiments, the $MZO_{nano}$ modification layer is simultaneously deposited by metalorganic chemical vapor deposition (MOCVD) or other chemical or physical deposition technologies, then patterned by photolithography and etching process, on both the sensing pad of the DGTFT sensor and the top electrode of the BAW sensor. Mg is introduced in-situ during the growth to form the ternary compound $Mg_yZn_{1-y}O$ ($0\leq y\leq 0.1$) to modify the physical and chemical properties of the ZnO-based nanostructures.

Some advantages of the $MZO_{nano}$ modification layer include: (i) nanostructured surface morphology of the $MZO_{nano}$ layer provides larger effective sensing surface area, and the bacteria also prefer to start adhesion at somewhere sheltered from shear forces; (ii) the superhydrophilic wettability enables the biosensor to consume much less liquid biosample amount and hence improve the sensitivity; and (iii) Mg doping is used to enhance its pH tolerance, reduce the toxicity to bacterial cells, and changes the surface morphology from sharp tip type to rough. These advantages ultimately enable such biosensor with $MZO_{nano}$ as the biological receptor to have much higher sensitivity and stable operation than conventional devices.

Controlling the surface morphology of $MZO_{nano}$ can enhance the binding of the nanostructure with certain biological cells. Manipulation of the morphology of the $MZO_{nano}$ also serves to maximize the sensitivity for particular cells and analytes.

$MZO_{nano}$ can be grown with various morphologies such as thin films and nanotips and nanorods on a large number of substrates including insulators, such as glass, quartz and $Al_2O_3$; semiconductors, such as Si, GaAs, GaN and SiC; electrodes, such as metals and transparent conductive oxides (TCO); and also on the flexible substrates such as polymers. In the embodiment, $MZO_{nano}$ are grown on the metal electrodes. The biofilms are developed on the $MZO_{nano}$ surface.

As used herein with respect to surface morphology of the $MZO_{nano}$, in some embodiments it has a surface roughness (rms, root mean square) of ~7.5 nm and is characterized by irregularities, protuberances, and/or ridges.

The wetting properties (from super hydrophobicity to super hydrophilicity, or vice versa) of the $MZO_{nano}$ can be controlled by adjusting the oxygen vacancy density at the $MZO_{nano}$ surface. The super-hydrophilicity of the nanostructures can be achieved through procedures such as UV light illumination, leading to a less liquid sample consumption and higher sensitivity.

The amount of Mg in $MZO_{nano}$ directly impacts important characteristics of the nanostructures, including surface morphology, stability and biocompatibility of $MZO_{nano}$ under various pH conditions. Further, a suitable range of Mg also leads to low-level toxicity of the MZO nanostructures; thus, enhancing the biocompatibility of the sensor. Therefore, the Mg composition in $Mg_yZn_{1-y}O_{nano}$ needs to be adjusted and optimized depending on the requirements of the sensing tasks. The y value is in the range of $0\leq y\leq 0.1$. In some embodiments, y ranges from about 0.01 to about 0.08, from about 0.01 to about 0.06, from about 0.01 to about 0.04, from about 0.02 to about 0.06, or from about 0.04 to about 0.08.

In some embodiments, fabrication the $MZO_{nano}$ may be accomplished using the procedures disclosed in the U.S. Pat. Nos. 8,377,683 and 9,064,965, the entire disclosures of which is hereby incorporated by reference.

The four terminals (bottom gate, top gate, source electrode and drain electrode) of the DGTFT device, the electrodes on the extended pad of DGTFT, and the electrodes of BAW are made of conducting materials. The substrates for constructing the DGTFT and BAW include rigid materials such as glass and ceramics, or flexible materials such as polymer.

Various materials can be used for fabricating components of the DGTFT device. For the channel layer, a small percentage of Mg composition is introduced into ZnO to form the ternary compound $Mg_xZn_{1-x}O$ (MZO). MZO keeps the main advantages of the pure ZnO but enhence the thermal and negative bias stress stability of the device. The x value in $Mg_xZn_{1-x}O$ is preferably in the range of $0<x\leq 0.06$. In some embodiments, x is about 0.01, about 0.02, about 0.03, about 0.04, or about 0.05. In some embodiments, the thickness of the channel is about 40 nm, but it may vary depending on the specification configuration of the device. In some embodiments, the channel layer has a thickness ranging from about 10 nm to about 300 nm, from about 30 nm to about 100 nm, from about 30 nm to about 70 nm, or from about 30 nm to about 50 nm.

An MgO barrier between the channel layer and the bottom dielectric layer minimizes the $Zn^{2+}$ ion diffusion into the dielectric layer and thus enhances the TFT characteristics and stability. In some embodiments, the barrier layer thickness is 3, 5, 7 or 9 nm. In some embodiments, the thickness ranges from about 1 to about 20 nm. The principle is that the barrier layer should be thick enough to effectively suppress the Zn diffusion; however, it also should be kept thin enough to keep the channel layer's integrity and thus, the device characteristics.

Suitable materials for the dielectric layers include $SiO_2$, $Al_2O_3$, $HfO_2$, AlN, and any combination thereof. In some embodiments, the top and the bottom dielectric layer are each made from $SiO_2$.

Another component of the MZO DGTFT biosensor is the sensing pad. While the bacterial cells adhere themselves onto the sensing pad $MZO_{nano}$ surface, the electrochemical interactions make a certain portion of cell surface charge transfer downwards to the supporting substratum. Then the transferred charges induce a micro-bias to the top gate and change the channel current through the field-effect. Thus, the onset of biofilm formation can be monitored.

The dual gate design of TFT provides two gates of which the sensing gate is used to sense the biological signal originated from the extended sensing pad. Due to the charge transfer happened on the sensing pad, the carrier distributions in the channel are electrostatically modified through the top gate, and hence influences the electrical characteristics of the device. The TFT device provides high amplification especially in the triode region of the transfer characteristics where it shows steep slope. Therefore, the bottom biasing gate is used to optimize the operation point of the device to achieve the best combination of high sensitivity and stable operations. The dual gate nature of DGTFT is exceptional suitable for biosensing applications.

The operation point of the MZO DGTFT biosensor is optimized by adjusting the bottom biasing voltage and obtains the trade-off between large signal variations (therefore high sensitivity) and the stable operations (therefore small standard deviation). The bottom biasing voltage is used to accumulate the electrons in the active n-type MZO channel and forms a conduction path from source to drain. The bottom gate biasing voltage is selected to a certain range or value to achieve high sensitivity and stable operation. In some embodiments, a bottom biasing voltage of −5.0, −3.0, 0.5, 1.0, 2.0 or 2.5 V is used. In some embodiments, the bottom biasing voltage ranges from −20 V to 20 V. In some embodiments, the bottom gate electrode contains chromium.

During the testing, a drain-source voltage ($V_{DS}$) is applied to form the conduction current. In some embodiments, the source is grounded and the drain is set at a constant voltage value ranging from 1 mV to 20 V. In some embodiments, the drain electrode and the source electrode each contain titanium and gold.

A data processing technique is used to take the first-order derivative of the drain current reduction as a function of incubation time, which demonstrates the rate of the charge transfer behaviors.

While the MZO DGTFT biosensor is designed mainly for early stage detection of biofilm formation, a BAW sensor combined with the DGTFT signal transducer for the dynamic detection of full-scale development of biofilm formation. QCM is a popular highly sensitive non-destructing BAW device that has a high-quality factor (Q) with an operating frequency in the range of several MHz to tens of MHz. Among the various applications, it has shown robust long-term dynamic monitoring capabilities for examining the overall sequence of biofilm development process. The high sensitivity demonstrated by the vibrational frequent shifts and motional resistance variations are attributed to the direct relationship of these signals to the mass accumulation and viscoelastic transitions of the bacterial cells on the device's sensing area. The status of biofilm formation can be dynamically recorded by measuring the viscoelastic transitions and mass accumulation in real-time through the sensor's time-evolving spectral signals. The acoustic admittance spectrum of the sensor can be automatically measured at a fixed time interval while the biofilm is developing. The output of the sensor device is then analyzed by extracting the peak frequency shifts and motional resistance and present in the form of time-frequency 3D signals.

The thin film bulk acoustic wave resonator (TFBAR) is an effective way to achieve miniaturization to chip level of the $MZO_{nano}$ QCM for integration of achieving a plug-in-card type of SOC. The general structure of TFBAR and its manufacturing are provided in U.S. Pat. No. 7,989,851, the entire disclosure of which is incorporated herein by reference. The TFBAR may have a layer of $MZO_{nano}$ at the top electrode as the sensing area. The TFBAR device is constructed on a nonconducting substrate (such as glass or polymer) to avoid the use of complex fabrication process (such as acoustic mirror) for reducing acoustic loss. Therefore, both the $MZO_{nano}$ TFBAR and the MZO DGTFT's extended sensing pad can be fabricated and integrated on the same chip substrate. Then it can form a plug-in-card type of biosensor when integrated with a circuit pad comprising of the DGTFT transducer, memory circuits, and data processing circuits. The miniaturized integrated system of biosensors has the advantage of being arranged into arrays for high throughput. In clinical applications, such hybrid technology would benefit the in-vitro study of biofilm formation and help medical professions to promptly treat patients with effective therapies.

Figure 13:
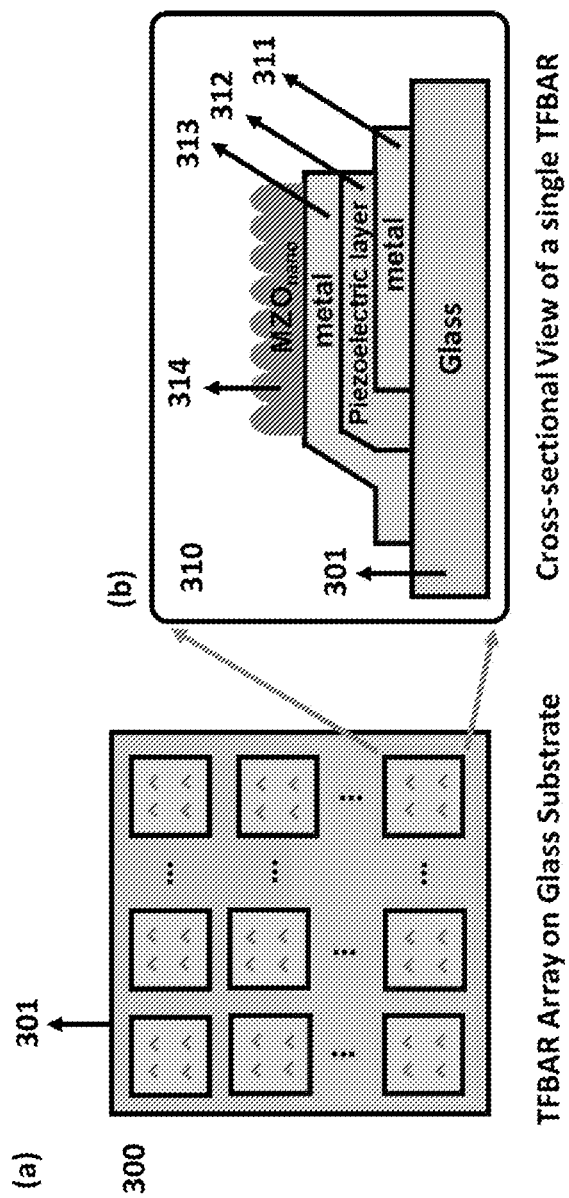
FIG. 13(a) shows a schematic top view of MZO$_{nano}$ TFBAR array built on glass substrate. (b) shows a schematic cross-sectional view of a single MZO$_{nano}$ TFBAR device.

An exemplary $MZO_{nano}$ TFBAR is provided in FIG. 13. As shown in its cross-sectional view (FIG. 13(b)), the sensor includes a piezoelectric layer sandwiched between two electrodes. The TFBAR device is constructed on a nonconducting substrate, such as glass or polymer, to avoid the use of acoustic mirror for reducing acoustic loss. Multiple TFBAR devices can be fabricated simultaneously and patterned in a single array for high throughput testing, as shown in FIG. 13(a). In the miniaturized embodiment of the device, both the $MZO_{nano}$ TFBAR and the MZO DGTFT can be fabricated and integrated into a plug-in-card type of hybrid sensor. The miniaturized integrated system of biosensors has the advantage of being low-cost and arranged into an array for high throughput. The piezoelectric layer can be prepare with materials generally known in the field. In some embodiments, the piezoelectric material includes Ni-doped or Cu-doped ZnO or MZO. The same MgZnO material group offers the advantages of less contamination, low cost of materials, equipment, and process.

By integrating the two complementary sensors into one hybrid sensor, dynamic monitoring of the full-scale stages of biofilm formation can be achieved, where the MZO DGTFT performing the early stage detection while the $MZO_{nano}$ BAW monitoring the subsequent stages of biofilm development. This is a truly multifunctional hybrid sensor as the technology combines the semiconductor MZO with the nanostructured MZO and also combining charge transfer mechanism with acoustic spectrum modulation to monitor the complete profile of each aspect of biofilm formation.

A related aspect of the patent document provides a kit including the biosensor described herein and one or more accessories, which include for example an incubator, user manual and a database for referencing and comparison with known detection results. For instance, the database may contain be control data from the detection of particular bacteria or any relevant statistics. Multiple sensors can be incorporated in one platform or kit in high throughput detection and monitoring. The sensor and kit disclosed in various illustrated embodiments in this patent document thus allow for efficient detection of biofilm formation.

Another aspect of the disclosure provides a method of detecting one or more stages of biofilm formation in a sample using the biosensor system described herein. The method includes contacting the sample with the nanostructures of the sensing pad for the DGTFT biosensor. If bacterial expansion and/or biofilm maturation are also to be detected, the method also includes contacting the nanostructures on the BAW sensor.

The sample can be in a liquid form or a solid form and can be prepared from residues on a substance or subject to be studied. For instance, a surface residue from a medical device or an implant can be prepared into a liquid sample or solution. By submerging the sensing pad into the sample solution, detection of the early stage or the full-scale process of biofilm formation can be achieved.

The method is applicable to the detection of biofilm formation from bacterial or fungal species or both. More specifically, when the bacterial or fungal species starts to produce EPS but before the accumulation of EPS at the growth stage, the method can effectively detect the process. Non-limiting examples include *Candida* spp., *Hormoconis* spp., *Pseudomonas* spp., *Pseudoalteromonas* spp., *Staphylococcus* spp., *Streptococcus* spp., *Shigella* spp., *Mycobacterium* spp., *Enterococcus* spp., *Escherichia* spp., *Salmonella* spp., *Legionella* spp., *Haemophilus* spp., *Bacillus* spp., *Desulfovibrio* spp., *Shewanella* spp., *Geobacter* spp., *Klebsiella* spp., *Proteus* spp., *Aeromonas* spp., *Arthrobacter* spp., *Micrococcus* spp., *Serratia* spp., *Porphyromonas* spp., *Fusobacterium* spp., and *Vibrio* spp. Additional representative examples include *Candida albicans, Pseudomonas aeruginosa, Staphylococcus epidermidis, Escherichia coli, Bacillus licheniformis, Serratia marcescens, Fusobacterium nucleatum,* and *Vibrio Cholerae.*

EXAMPLES

Example 1: Fabrication of the MZO DGTFT and the $MZO_{nano}$ QCM Biosensors

Fabrication of the MZO DGTFT Transducer

The MZO DGTFT device 100 is the key component and serving as the signal transducer of the DGTFT biosensor.

Figure 2:
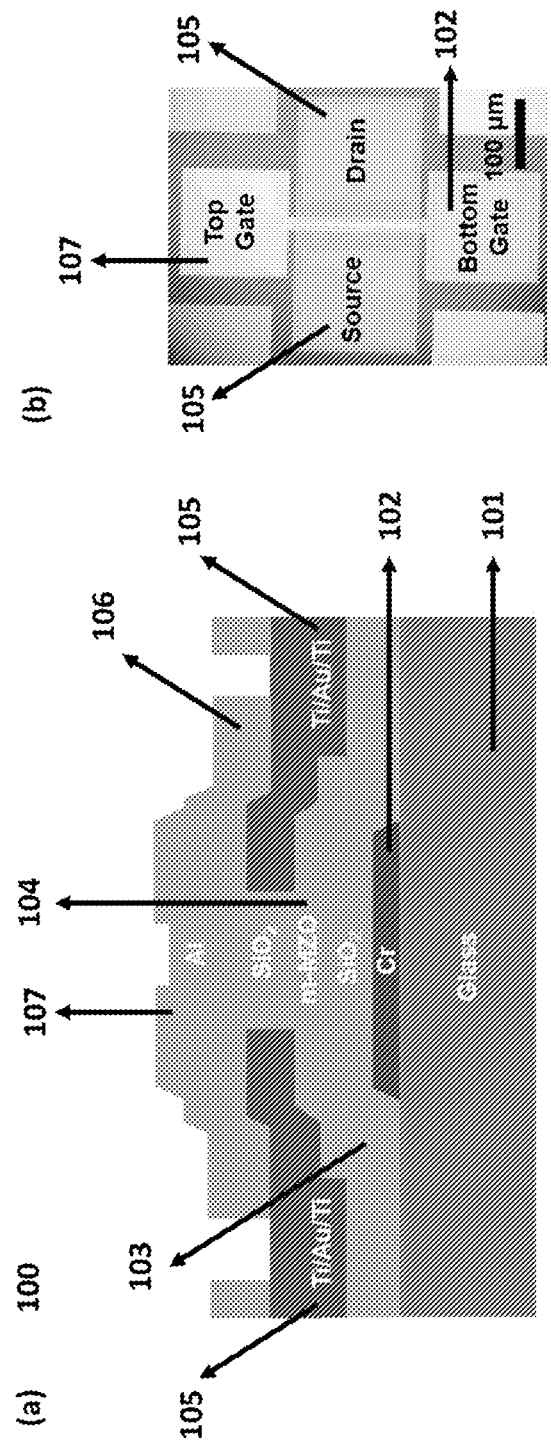
FIG. 2 shows the detailed structures of the MZO DGTFT device: (a) A cross-sectional schematic drawing of the MZO DGTFT, where the m-MZO presents the combination of the ultra-thin MgO diffusion barrier and the MZO active channel layer. (b) The microscopic top view of the DGTFT.

The detailed structure of the MZO DGTFT is shown in FIG. 2. A 50-nm-thick Cr layer 102 was first deposited using electron beam evaporation and then patterned using the standard photolithographic method to form the bottom gate electrode on a glass substrate 101. Then a $SiO_2$ film 103 (100 nm) was deposited on top of the Cr bottom gate as the gate dielectric layer using plasma enhanced chemical vapor deposition (PECVD). A 5 nm MgO interfacial layer followed by a 40 nm $Mg_{0.03}Zn_{0.97}O$ channel layer 104 was deposited using metal organic chemical vapor deposition (MOCVD) at ~400° C., to form a $SiO_2$/MgO/MZO structure. In MOCVD, DeZn (Diethylzinc), $MCp_2Mg$ (bis-(methyl-cyclopentadienyl) magnesium), and ultra-high purity (99.999%) oxygen gas were used as the Zn metalorganic source, Mg metalorganic source, and oxidizer, respectively. The active mesa area (W/L=160 μm/15 μm) was formed through wet etching. The source and drain contacts 105 were formed through metallization process (85 nm Ti/35 nm Au/5 nm Ti) followed by a lift-off process. Then the top $SiO_2$ dielectric layer 106 (70 nm) was deposited by PECVD again. Next, a 150-nm-thick Al layer 107 was deposited by electron beam evaporator as the top gate electrode and then patterned. Finally, VIA openings were made using buffered oxide etch solution. The microscopic top view of the DGTFT is shown in FIG. 2(b).

Fabrication of the Sensing Pad Receptor

Figure 3:
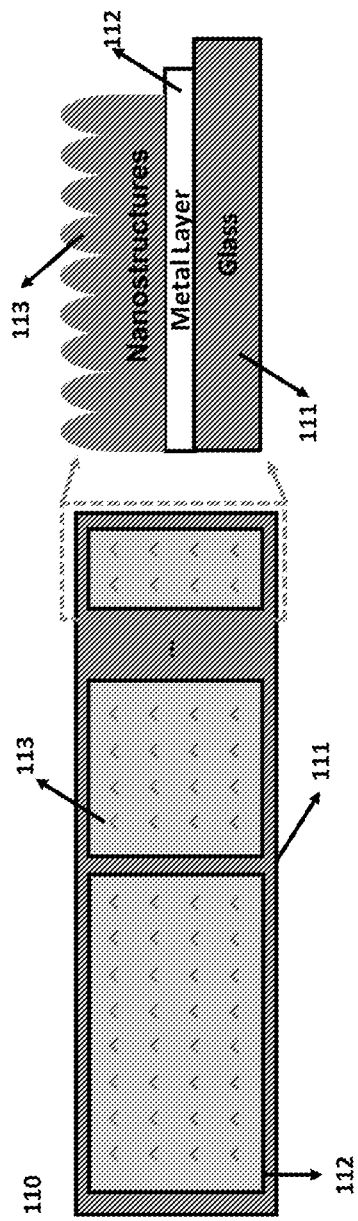
FIG. 3 (a) shows the schematic top view of the DGTFT's extended sensing pad with multiple nanostructure modified sensing areas of different dimensions. (b) shows the schematic cross-sectional view of one of the sensing areas.

In this MZO DGTFT biosensor, the pad 110 (shown in FIG. 3) is used as the extended sensing gate (biological receptor) which is connected to the top gate of DGTFT device. The fabrication started from depositing a 5 nm Cr/50 nm Au metal layer 112 using electron beam evaporation process on glass substrate 111, which serves as the conducting electrode. The metal layer was then patterned and wet etched to form squares of 120 $mm^2$, followed by the growth of nanostructures by MOCVD. The nanostructured layer was then patterned and wet etched, while leaving a small area of the metal pad open for electrical contact.

Fabrication of the $MZO_{nano}$ QCM

Figure 4:
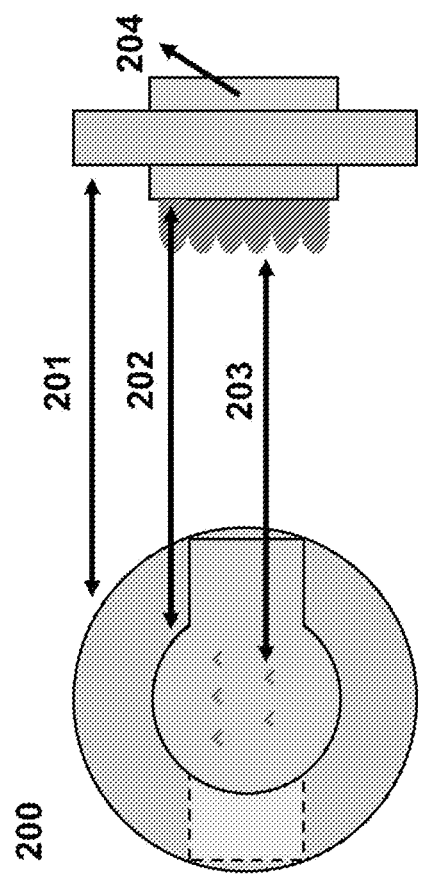
FIG. 4 shows the schematic top and cross-sectional view of the $MZO_{nano}$ QCM.

The $MZO_{nano}$ QCM device 200 (shown in FIG. 4) consist of an $MZO_{nano}$ layer 203 that is integrated with a standard AT-cut QCM by growing them directly on the top electrode surface of the QCM using MOCVD. Same growth conditions of the $MZO_{nano}$ were used. The standard QCM's quartz layer 201 is sandwiched by two 100 nm gold electrodes 202 and 204. The sensing area of the QCM is 20.47 $mm^2$. The operation frequency of the standard QCM is 10 MHz, while the $MZO_{nano}$ QCM has an operating frequency of 9.912 MHz.

Growth of the Nanostructure Modification Layer on the Sensing Surfaces

The $MZO_{nano}$ layers were simultaneously deposited on both the extended sensing pads of DGTFT and the top electrodes of QCM to serve as the sensing surfaces to enhance their sensitivities and biocompatibilities. For comparison, $ZnO_{nano}$ was also deposited on some other sensing pads of the DGTFT biosensor. The 400 nm thick $Mg_{0.04}Zn_{0.96}O_{nano}$ and $ZnO_{nano}$ films were respectively grown using MOCVD at ~500° C. and the chamber press was maintained at ~60 Torr. Same precursors and oxidizer as the channel layer were used. Then the $MZO_{nano}$ and $ZnO_{nano}$ underwent UV illumination to get the super-hydrophilic characteristics to achieve high sensitivity and minimize the bio-sample consumption. The resulting $MZO_{nano}$ and $ZnO_{nano}$ sensing surfaces possess optimized morphology and wettability, which leads to a higher sensitivity of the devices.

Example 2: Early Stage Detection of *S. epidermidis* Biofilm Formation Using the MZO DGTFT Biosensor Biological Sample Preparation

*S. epidermidis* ATCC 35984 was inoculated into TSB (tryptic soy broth) medium and then grown at 37° C. for 16-18 h with shaking at 200 rpm. The pH of the culture medium is 7.4 which is close to neutral when prepared according to the manufacturer's prescription. The stationary phase cultures were diluted 100-fold into fresh TSB medium pre-loaded in 10 cm quad-plate petri dish, with each sector containing 5 mL cultures. The $MZO_{nano}$ and $ZnO_{nano}$ sensing pads were sterilized and placed into the bacterial cultures, with the sensing area being up to allow bacterial adhesion.

Crystal Violet Staining Assay

The same procedure was followed as describe above but adding one more sensing pad incubated in TSB medium without bacteria as a control. The dishes were incubated statically at 37° C. for biofilm formation. After incubation for 100 min, 200 min, 8 h, 16 h and 24 h, the sensing pads from the cultures were washed three times with 5 mL 0.9% NaCl to remove planktonic cells. Biofilms attached on the sensing surface were then stained using 0.2% crystal violet for 10 min, followed by washing three times with 0.9% NaCl. 100 μL of 30% ethanol was added to each sensing pad to release bound crystal violet when the crystal violet staining solution was removed. The absorbance value was measured at 590 nm using absorption plate reader.

Electrical Measurements and Parameters Extraction

The MZO DGTFT was placed inside a light-tight measurement station. Its three terminals, i.e. source, drain, and bottom gate electrodes were electrically connected to the semiconductor parameter analyzer HP-4156C. A bottom gate biasing voltage $V_{BG}$ was swept between −5 V to 15 V to optimize the operation point of the MZO DGTFT. The drain was set at 0.1 V whereas the source was grounded. The top sensing gate of the DGTFT was connected to the $MZO_{nano}$ or $ZnO_{nano}$ sensing pad outside of the measurement station. The schematic experimental setup is shown in the left side of FIG. 5.

The threshold voltage $V_{TH}$ of the device was extracted using the linear fitting method for 10%-90% of the maximum drain current. The subthreshold slope S.S. value is extracted from a 3-decade range in the subthreshold region ($I_D$=$10^{-12}$–$10^{-9}$ A) of the transfer characteristics in logarithm scale.

Electrical Characterization of the MZO DGTFT for Biosensor Operation

Figure 6:
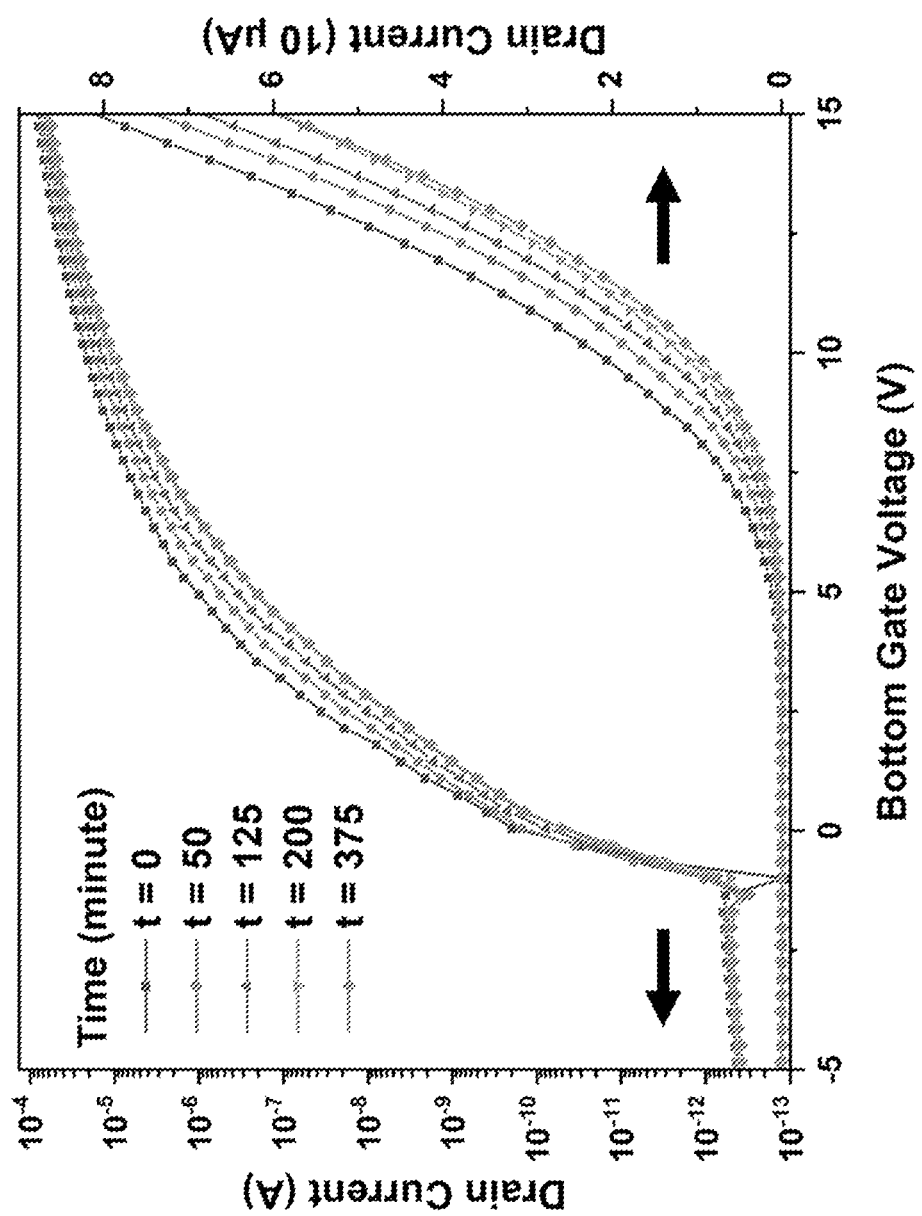
FIG. 6 shows the electrical transfer characteristics of an MZO DGTFT biosensor during S. epidermidis growth in TSB (tryptic soy broth) medium recorded at different times. Left axis presents the drain current in logarithm scale whereas the right axis presents the same data in linear scale.

Before utilizing the MZO DGTFT biosensor to dynamically monitor the formation of *S. epidermidis* biofilms, three aspects, i.e. the electrical characteristics of the MZO DGTFT without bioreaction, the change of the electrical characteristics during growth of *S. epidermidis* on the extended sensing gate, and the proper biasing voltage on the bottom gate of DGTFT to attain the best combination of high sensitivity and stable operation were determined. The MZO DGTFT biosensor was initially tested while the top gate was connected to the extended $MZO_{nano}$ sensing pad that was immersed in TSB medium and let the signal stabilize to baseline value. *S. epidermidis* bacterial culture solution of predetermined volume was introduced into the sensing pad with TSB medium at time t=0 and let the device incubate for biofilm formation. The transistor transconductance plot (i.e. I-V curves of drain current vs bottom gate bias voltage) were recorded at times t=0, 50, 125, 200, and 375 min of incubation time. FIG. 6 shows the electrical transfer characteristics of an MZO DGTFT during *S. epidermidis* growth. The curve at t=0 shows the threshold voltage of 8.4 V, subthreshold swing of 510 mV/dec, and on-off ratio of ~$10^8$. The steep slope (small value of subthreshold swing), and high on-offratio indicate high signal gain, therefore high sensitivity of the biosensor.

From the I-V curves in FIG. 6, the drain current dramatically decreases as incubation time increases from t=0 to 200 min; however, afterwards, i.e. 200 min<t<375 min, there is no significant change. It should point out that the DGTFT offers the flexibility to tune the sensitivity through the biasing. This initial setting serves as the calibration of the device. The observed modulation of the drain current of the MZO MGTFT biosensor as a function of biofilm formation time is attributed to the electron charge transfer, resulted from the bacterial adhesion to the $MZO_{nano}$ surface.

The bottom gate biasing voltage is used to optimize the sensor's operation point. The I-V curves in the right side of FIG. 6 shows the electrical characteristics as a function of incubation time plotted in linear scale, where it seems the drain current change as a function of time at any bottom gate biasing voltage between 10 V to 15 V could be used with good sensitivity. However, if the same curves are plotted in the logarithmic scale as shown in the left side of FIG. 6, it can be seen that there is a narrower range of bottom gate voltages that would be most suitable for sensor operation with high sensitivity. The slope of I-V transconductance plot at the triode region is much larger, and hence the current changes are more discernible. Beyond this range, the TFT enters the saturation region, where the current does not change significantly as incubation time increases, in comparison with the triode region.

Real-time monitoring of the early stage biofilm formation

The real time monitoring of the early stage formation of *S. epidermidis* biofilms using the MZO DGTFT sensor was studied. Three $MZO_{nano}$ sensing pads were prepared and the detection of *S. epidermidis* biofilms was repeated three times using the same MZO DGTFT device under the same microbial culture conditions. The *S. epidermidis* bacteria were injected at t=0. For a field-effect transistor (FET) type of biosensor, the sensitivity of the device is characterized as the relative variation (Rel. Var.) of drain current at a certain operation condition. EQ. (1) was used to calculate it as a function of time:

$$Rel.\ Var. = \frac{I_D(t) - I_D(0)}{I_D(0)} \times 100\% \qquad (1)$$

where $I_D(t)$ is the drain current measurement at time t, and $I_D(0)$ is the drain current measurement at the start time. The mean value and standard deviations of these relative variations were then taken from the three experiments.

The bottom gate biasing voltage is used to optimize the operation point of the measurement. In the triode region of the I-V characteristic curves, the plots possess a steep slope which enhances the sensitivity; however, in the saturation region of the I-V curves, the sensitivity dramatically decreases as the slope is much smaller. To investigate the effect of bottom gate biasing voltage on the sensitivity for detection of biofilm formation, the sensor was operated at $V_{BG}$ of 0, 2 V, 10 V, and 15 V, respectively. For each sample, the measurements were made sequentially every 25 min for a total of 375 min of the incubation time.

Figure 7:
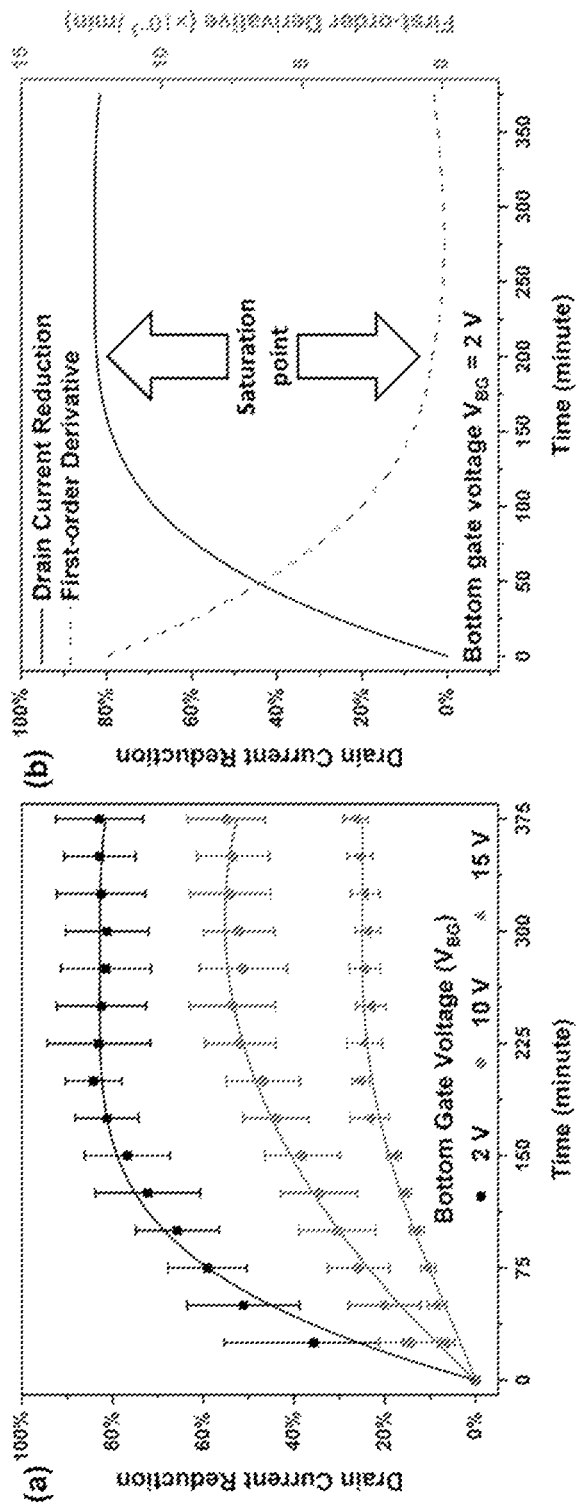
FIG. 7 shows the early stage detection of S. epidermidis biofilm formation: (a) The relative variations of drain current reduction during S. epidermidis biofilm growth are extracted from the DGTFT transfer characteristics. Three different bottom gate biases ($V_{BG}$=2 V, 10 V, and 15 V) are presented as a function of incubation time. No significant current variation is observed without bacterial inoculum. (b) The fitting curve of relative current reduction when $V_{BG}$=2 V is plotted with its first-order derivative. The current change saturates at about t=200 min, which indicates the end point of S. epidermidis biofilm early stage detection.

The mean values of drain current variations as a function of incubation time and their corresponding error bars for standard deviation are presented in FIG. 7(a). The current variation at $V_{BG}$=0 V is not shown in the figure due to large error bars (average standard deviation: 24.6%). For all four bottom gate biasing voltages, the percentage change in drain current shows significant decreasing values starting from the introduction of the bacterial culture on the $MZO_{nano}$ sensing pad (t=0) until saturation at about t=200 min. However, it can be seen that there is a trade-off between the sensitivity and stable operation for different bottom gate biases. At $V_{BG}$=15 V, the sensor exhibits smallest standard deviations indicating higher accuracy compared to the other biasing conditions. This is due to the fact that under large bottom gate bias, the TFT enters into the saturation region, where the conduction channel is fully occupied by electrons. On the other hand, the biosensor's sensitivity, which represents by the total percentage changes of drain current, is higher when operated at a lower bottom gate biasing as compared to the one at $V_{BG}$=15 V, which could be attributed to the steep slope in the triode region of the characteristic curve.

Table 1 lists the experimental results on the slopes of the transfer characteristics, maximum current changes, and the average standard deviations at these four different bottom gate voltages. From the table, although the highest drain current change was found when bottom gate was grounded (i.e. $V_{BG}$=0), the standard deviation (24.6%) is too large to make the stable and reliable operation. Therefore, $V_{BG}$ of 2 V is selected as the optimized operation point. At this condition, the device provides high sensitivity in terms of the total percentage reduction in drain current (82.9%) and the stable operation represented by a small standard dispersion (10.1%). FIG. 7(b) represents the fitting curve of drain current variation as a function of incubation time for bottom gate bias $V_{BG}$ of 2 V. The current change saturates at about 200 min which signifies the detection point of the onset of biofilm formation. The maximum current reduction of 82.9% is reached at incubation time t=375 min.

TABLE 1

| Bottom gate voltage $V_{BG}$ (V) | 0 | 2 | 10 | 15 |
|---|---|---|---|---|
| Slope of the I-V curve when t = 0 min (V/dec) | 0.44 | 0.93 | 6.35 | 12.62 |
| Maximum current reduction (%) | 88.0 | 82.9 | 54.9 | 26.4 |
| Average standard deviation (%) | 24.6 | 10.1 | 7.6 | 5.4 |

In FIG. 7(b), it can be seen that the sensor's drain current decreases rapidly as incubation time goes from t=0 to 200 min, after which the current levels off. The decrease in drain current signifies that electron transfer has occurred between the bacterial cells and the $MZO_{nano}$. Electrons are produced by the bacterial cells during metabolism. In the case of cell adhesion, these bacterial electrons are transferred to the electrodes or semiconducting layer such as the MZO nanostructures through a pathway called direct electron transfer (DET). The DET mechanism creates a pathway for the bacterial electron to the sensor's electrode via the bacteria's outer membrane cytochromes and conductive cell appendages. These cytochromes and conductive appendages are a product of the cell membrane due to the bacterial cell adhesion to the surface of the electrode.

While the *S. epidermidis* bacterial cells are adhering to the sensing pad and gradually proliferate, more and more negative charges are transferred from bacterial cell surface to the semiconducting $MZO_{nano}$ sensing pad. The transferred charges introduce negative micro-bias, acting onto the MZO DGTFT's top gate. It decreases the current in the MZO channel through the electric field effect. The equivalent top gate micro-bias due to the adhered S. epidermidis cells can be determined from the threshold voltage shift $\Delta V_{TH}$ using EQ. (2).

$$V_{TG} = -\frac{C_{BI}(C_{TI} + C_{MZO})}{C_{TI}C_{MZO}}\Delta V_{TH} \quad (2)$$

where $V_{TG}$ is the micro-bias at the top gate due to the charge transfer, $\Delta V_{TH}$ is the threshold voltage shift, $C_{BI}$, $C_{TI}$, and $C_{MZO}$ respectively represent the bottom gate, top gate, and the channel layer capacitance per unit area. The induced charge Q at the top gate electrode was calculated using EQ. (3):

$$Q = AC_{TI}V_{TG} \quad (3)$$

where A is the area of the top gate capacitor. From FIG. 6, the threshold voltage is found to shift in the positive voltage direction by ~1.6 V from t=0 to 375 min; therefore, approximately $10^{-12}$ C amount of equivalent charge is induced to the top gate-dielectric interface through the micro-bias caused by the attached bacterial cells on the $MZO_{nano}$ sensing pad.

Both the threshold voltage change and the drain current variation could be used as the signals to represent the biofilm development process. However, the drain current varies much more significantly (~80% current variation when $V_{BG}$=2 V) in comparison with the threshold voltage change (~19% threshold voltage variation). This contrast is especially obvious in the triode region of the transfer characteristics, which is selected as the operation region for sensing. Therefore, the drain current variation is chosen as the signal to represent the biofilm development process with high sensitivity.

The first-order derivative curve of the drain current reduction versus time is shown in FIG. 7(b). The DGTFT drain current dramatically decreases at the beginning of the test (large first-order derivative), resulting from the adhesion of S. epidermidis bacteria. Although the biofilms were still developing and far from maturation, the charge transfer effect between bacterial cell surface and substratum $MZO_{nano}$ surface was being inhibited gradually (decreasing first-order derivative), and diminished at about 200 min. The charge transfer between the bacterial cells and the substratum is an interfacial phenomenon, and once the sensing area is covered by the interfacial adhesion cells, there will be no more charge transfer. In addition, the bacterial adhesion could induce a change in the electrical potential of substratum, and the potential change induced per adhering bacterium would decrease during the adhering process and eventually becomes zero, i.e. further charge transfer is hampered by the initial amount of charge transferred. There is no lag phase exhibited by the bacterial culture and can be attributed to having the bacterial culture introduced are already in a metabolically active state and does not require time to enter cell division.

Figure 8:
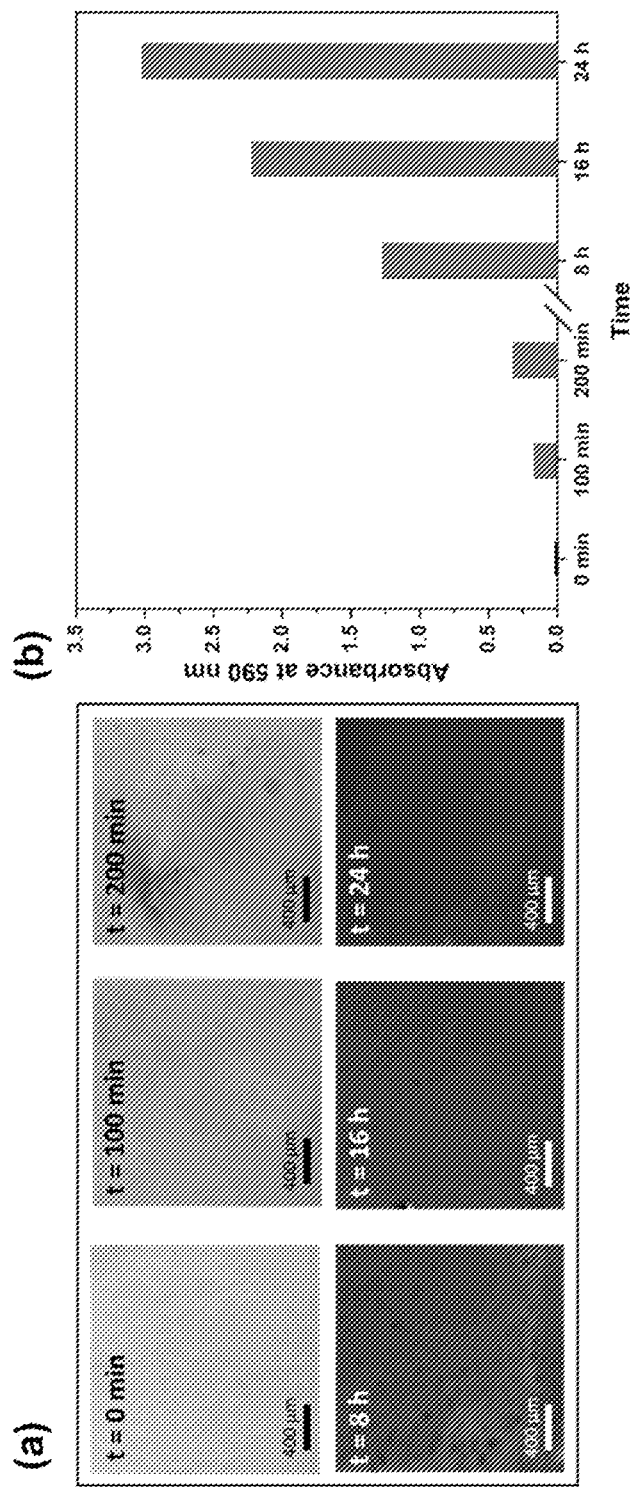
FIG. 8 shows the imaging of biofilm formation process of S. epidermidis: (a) Optical images of crystal violet stained S. epidermidis biofilms on the MZO$_{nano}$ surface, recorded at 0, 100 min, 200 min, 8 h, 16 h, and 24 h of incubation time. (b) Quantification of the biofilm formation process at different times of culture by measuring the absorbance at 590 nm.

Crystal violet staining assay was used to verify that the biofilms were indeed formed on the $MZO_{nano}$ sensing pads and reflected the time dependent long-term process of biofilm development. $MZO_{nano}$ films were grown on the same glass substrates as the sensing pads, then they were introduced in the same bacterial biofilm incubation process. Optical images of the $MZO_{nano}$ coated glass substrates were respectively taken at incubation time t=0, 100 min, 200 min, 8 h, 16 h, and 24 h (as shown in FIG. 8(a)). For each times of culture, its absorbance values were also measured at the wavelength of 590 nm after the bound crystal violet was released (as shown in FIG. 8(b)). The absorbance measurement was repeated three times with an average standard deviation of 0.015. The value of crystal violet absorbance increases from 0.12 at t=100 min to 0.28 at t=200 min. Concomitantly, the current of the DGTFT biosensor decreases from $6.60 \times 10^{-9}$ A at t=100 min to $3.00 \times 10^{-9}$ A at t=200 min. Therefore, the statistical correlation between these two results obtained by different techniques is achieved. From the biosensor standpoint, t=200 min is the moment when the signal starts to saturate, indicating that cellular adhesion has taken place. It is defined as the onset of biofilm formation. However, at 200 min, the crystal violet staining assay results show that tiny bacterial microcolonies just start to form at the sites of adhesion as shown in FIG. 8(a). Afterwards, with the EPS production and bacterial cell proliferation, it took approximately 24 h to develop into the matured biofilms.

Initial bacterial adhesion is the onset of biofilm formation, and it is detected no longer than 200 min by using the novel MZO DGTFT biosensor. Crystal violet staining assay shows bacterial microcolonies just form up at 200 min and the biofilms get matured at approximately 24 h. Thus, the trend of biofilm formation has been predicated at its early stage, allowing medical professionals to act ahead of time to inhibit the subsequent biofilm formation.

Effects of Nanostructures ($MZO_{nano}$ vs $ZnO_{nano}$) on Sensing Performance

The effects of DGTFT using different nanostructures as the extended sensing gate are studied. The extended sensing gates are made up of $MZO_{nano}$ and $ZnO_{nano}$, respectively. It is well known that ZnO can alloy with MgO to form the ternary compound $Mg_yZn_{1-y}O$ to extend the energy bandgap. The direct energy bandgap of wurtzite-structured $Mg_yZn_{1-y}O$ can be tuned up to ~4.0 eV (y=0.34). The energy bandgap of $Mg_xZn_{1-y}O$ follows Vegard's law:

$$E_g(Mg_yZn_{1-y}O) = yE_g(MgO) + (1-y)E_g(ZnO) \quad (4)$$

where $E_g(Mg_yZn_{1-y}O)$, $E_g(MgO)$ and $E_g(ZnO)$ are the energy bandgaps of MZO, MgO and ZnO, respectively. For small y value, the $E_g(Mg_yZn_{1-y}O)$ can be estimated by the linear approximation:

$$E_g(Mg_yZn_{1-y}O) = E_g(ZnO) + by \quad (5)$$

where b is a constant number from fitting.

Figure 9:
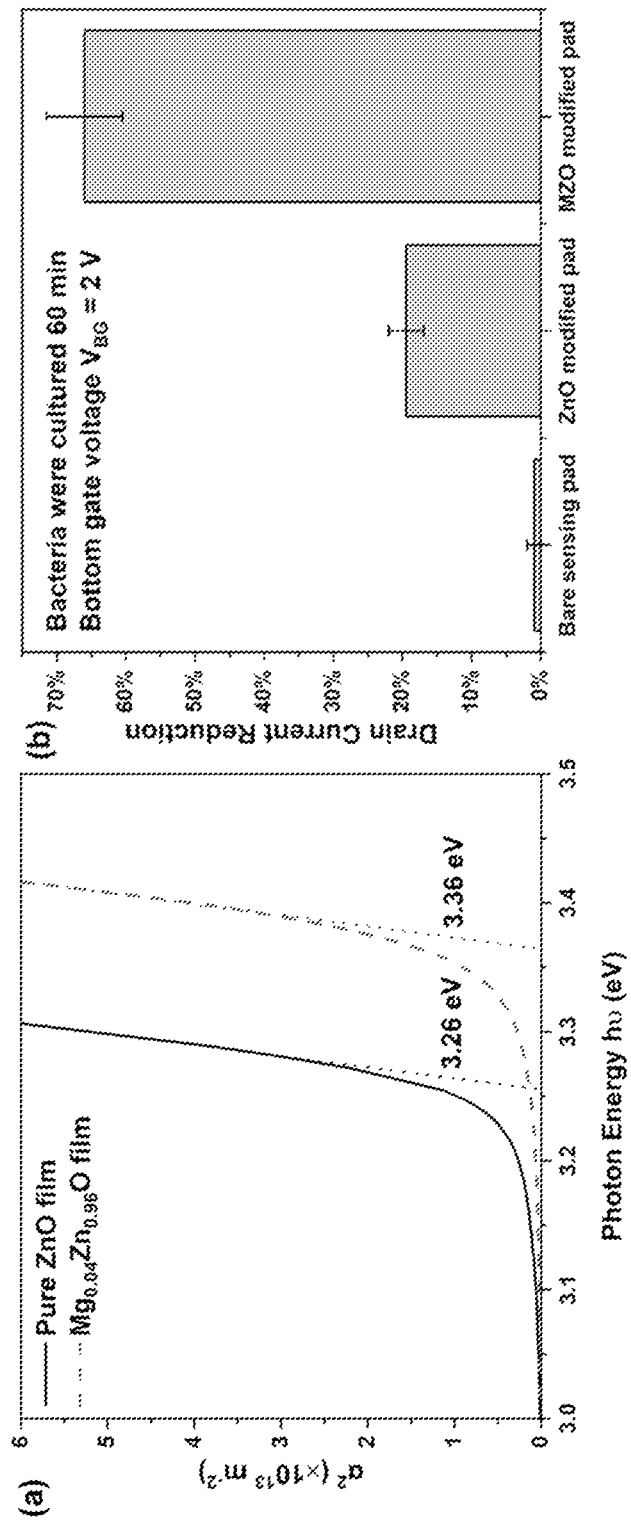
FIG. 9 shows the detection of S. epidermidis biofilm formation on different sensing materials: (a) The optical absorption measurements were performed for both ZnO and MZO films on glass substrates, respectively. The absorption coefficient squares $\alpha^2$ are plotted against photon energy hv for ZnO and MZO films. The bandgaps of ZnO and MZO films are determined to be 3.26 eV and 3.36 eV, respectively, which indicates the y value in $Mg_yZn_{1-y}O$ to be 0.04. (b) S. epidermidis biofilms were respectively incubated on bare sensing pads, ZnO$_{nano}$ pads, and MZO$_{nano}$ pads for 60 min. The same MZO DGTFT was used to conduct the experiments. Bottom gate voltage was set at 2 V. The relative variations of drain current reduction were obtained comparing with the same type of pad without bacteria incubation.

Here, the energy bandgaps of MZO and ZnO are experimentally determined by optical absorption measurements. Near the absorption edge, the relationship between the absorption coefficient $\alpha$ and the photon energy hv is given by EQ. 6:

$$\alpha \propto (hv - E_g)^{1/2} \quad (6)$$

where $\alpha$ is the absorption coefficient, hv is the photon energy, and $E_g$ is the energy bandgap. By measuring $\alpha^2$ versus hv respectively for $Mg_yZn_{1-y}O$ (MZO) and ZnO, and then curve fitting, the energy bandgaps $E_g$ can be determined. FIG. 9(a) shows the measured curves of $\alpha^2$ versus hv, where the bandgaps of ZnO and $Mg_yZn_{1-y}O$ (MZO) are determined to be 3.26 eV and 3.36 eV, respectively. The linear relationship in EQ. 5 is then used to decide the y value in $Mg_yZn_{1-y}O$ to be ~0.04 (4%), where b≈2.5.

S. epidermidis biofilms were cultured on the bare sensing pads (Cr/Au coated glass, i.e. metal/glass), pure ZnO nanostructures (ZnO$_{nano}$ on metal/glass), and MZO nanostructures (MZO$_{nano}$ on metal/glass) modified sensing pads for 60 min under the same conditions, respectively. These three different sensing pads were then separately connected to the top gate of the same MZO DGTFT. The electrical measurements were performed for each of them. The bottom gate voltage was set at V$_{BG}$=2 V, and the relative drain current reductions were obtained in comparison with the same type of pad without biofilm incubation. The same experiment was repeated three times for each type of the sensing materials. Shown in FIG. 9(b) are the mean values of the drain current reduction and the standard deviation error bars of the DGTFT with each sensing pad, respectively. The bare sensing pad without nanostructure coating essentially failed bacterial measurements due to low sensitivity while both devices with the ZnO$_{nano}$ or MZO$_{nano}$ sensing pad were able to detect the drain current reduction; 19% and 66%, respectively.

From the comparison, it is clear that the modification of sensing surface with the ZnO$_{nano}$ and MZO$_{nano}$ can achieve higher sensitivity; therefore, enabling the early stage detection of biofilm formation. The surface roughness impact on the biofilm formation can be explained by two factors. First, the bacteria prefer to start adhesion at somewhere sheltered from shear forces so that they have time to change from reversible to irreversible attachment. Second, the effective area for adhesion is significantly increased due to the roughening of surface. In addition, the ZnO$_{nano}$ and MZO$_{nano}$ underwent UV light illumination and thus exhibited super-hydrophilicity. The super-hydrophilicity enables less liquid sample consumption and higher sensitivity.

The above comparative studies also demonstrate that the sensing pad with the MZO$_{nano}$ modification offers much high sensitivity over the pure ZnO$_{nano}$ counterpart. ZnO would release Zn$^{2+}$ ions in acidic environment, and that the Zn$^{2+}$ ions are toxic to bacterial cells. The Zn$^{2+}$ ion formation proceeds as follows:

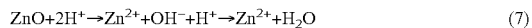

$$ZnO+2H^+ \rightarrow Zn^{2+}+OH^-+H^+ \rightarrow Zn^{2+}+H_2O \qquad (7)$$

where, the Zn—O bond in ZnO$_{nano}$ can be easily attacked by hydronium ions in acidic solutions. In our case, as the biofilms secreted by S. epidermidis is acidic with a pH value between 4-5, the chemical reaction holds. The use of pure ZnO$_{nano}$ sensing pad could decrease the sensitivity of the biosensor as the Zn$^{2+}$ ions migrating into the growth medium and thus the cells are killed to some extent. By adding small composition of MgO (~4%) into pure ZnO to form the MZO, Zn$^{2+}$ ions are significantly reduced due to the stronger bonding between Mg and the metal oxide surface compared to Zn. In this work, MZO$_{nano}$ is chosen as the optimized sensing material over pure ZnOano to reduce the toxicity to S. epidermidis; therefore, improve the device sensitivity.

Figure 5:
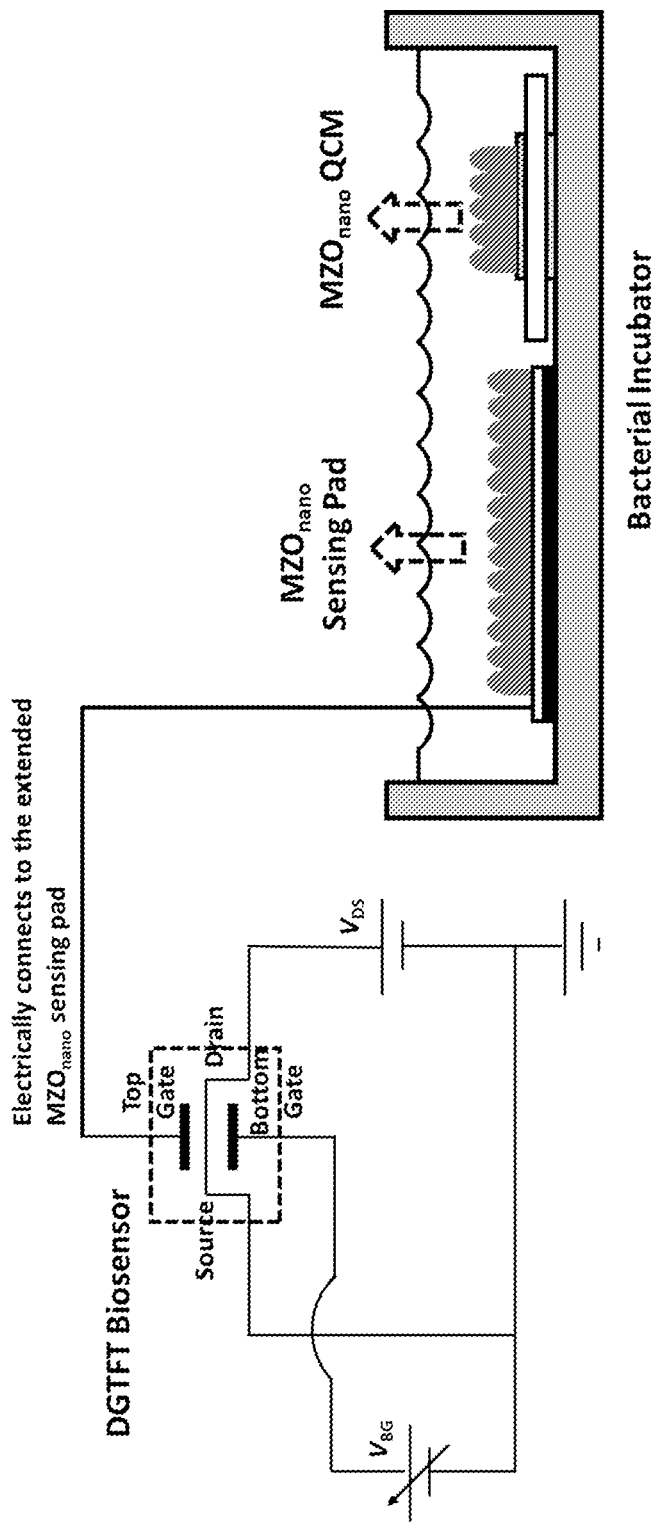
FIG. 5 shows the testing system consisting of (i) MZO DGTFT biosensor with the $MZO_{nano}$ modified extended gate for the early stage detection of biofilm formation and (ii) $MZO_{nano}$ QCM for monitoring the subsequent stages, and (iii) a bacteria incubator. The MZO$_{nano}$ structures are simultaneously grown on the extended gate pad and on the top electrode of QCM.

Example 3: The Full-Scale Dynamic Detection of P. aeruginosa Biofilm Formation Using the MZO$_{nano}$ Modified Multifunctional Sensors Biological Sample Preparation Pseudomonas aeruginosa (P. aeruginosa) PAO1 as inoculated into MHB (mueller hinton broth) medium and grown at 37° C. for 16-18 h in test tubes placed in a shaking incubator operating at 200 rpm. The stationary phase cultures were diluted 100-fold into fresh MHB medium pre-loaded in the Teflon cell culture well. The extended MZO$_{nano}$ sensing gate of DGTFT and the MZO$_{nano}$ QCMs were sterilized and placed into the wells. The biofilms were grown in the wells and the growing process was monitored by the DGTFT biosensor and the MZO$_{nano}$ QCM (as shown in FIG. 5).

Crystal Violet Staining Assay

We used the crystal violet staining to verify the biofilm formation process on the MZO$_{nano}$ surfaces. MZO$_{nano}$ was deposited on glass substrates and then divided into two sets: one for control and one for testing. Both sets were prepared through the same procedures as outlined above, however, for the control set the MZO$_{nano}$ glass substrates were incubated with only MHB growth medium lacking bacteria. The separate Petri dishes containing the control and testing sets each containing multiple samples were placed in a static incubator at 37° C. to induce biofilm formation. At various time points during incubation, one sample each from the control and testing sets were retrieved for crystal violet staining. The time points of retrieval were 0, 1.7 h (100 min), 3.3 h (200 min), 5 h (300 min), 8 h, 15 h, and 24 h, which covers the biofilm development at different times. After removal from the culture, the sample were washed three times with 5 mL 0.9% NaCl solution to remove planktonic cells to ensure that only the biofilms were attached on the sensing surfaces. Biofilm attached on the sensing surface was then stained using 0.2% crystal violet for 10 min, followed by washing three times with 0.9% NaCl. The microscopic images were then taken for each time point.

Measurement and Parameters Extraction for the MZO DGTFT Biosensor

In the first step of measurement, the basic electrical characteristics of the MZO DGTFT were examined. The transistor transconductance plots (i.e. I-V curves of drain current I$_D$ vs bottom gate bias voltage V$_{BG}$) were recorded with various top gate bias (V$_{TG}$). Then, the control experiment with MHB medium only was tested three times for 660 min. The results showed an average drain current variation of 1.6% with an average standard deviation of 2.9%. Comparing with the actual biosensing results which will be discussed later, such background variations are negligible. Next, the transfer characteristic variations, as a result of the early stage detection of the P. aeruginosa biofilm formation, were obtained. As the electrons from bacterial membrane transfer to the MZO$_{nano}$, an equivalent micro biasing voltage is applied to the top gate of the DGTFT. Such top gate bias changes the conducting current I$_D$ flowing through the channel layer via the electric field effect. By extracting the current variations under proper bottom gate biasing voltage V$_{BG}$, the optimized signal output can be realized with the best combination of high sensitivity and stability. At last, its time-dependent signal response with standard deviation error bars is presented in combination with the QCM's results to form the full-scale monitoring results.

Throughout the experiment, the MZO DGTFT was placed inside a light-tight measurement station. Its top gate was electrically connected to the extended MZO$_{nano}$ sensing pad where the bacterial incubation took. The electrical measurements were carried out using the HP-4156C semiconductor parameter analyzer. The V$_{BG}$ was swept between −5 V to 15 V to find the optimum point of operation. Its source electrode was grounded and the drain electrode was maintained at 0.1 V to minimize power consumption.

MZO$_{nano}$ QCM Measurement and Data Analysis

The MZO$_{nano}$ QCM was used to monitor the long-term (24 h) development process of P. aeruginosa biofilm formation. The device was placed in a standard bacterial incubator with controlled ambient environment. The characterization of MZO$_{nano}$ QCM was conducted using an HP-8573D network analyzer, which was connected via IEEE-488 general purpose interface bus (GPIB) to the universal serial bus (USB) of a microprocessor running of a LabView data acquisition program. The impedance transmission spectrum $Z_{21}(\omega)$ of the device was automatically measured at fixed time intervals and digitally stored. The impedance transmission spectrum $Z_{21}(\omega)$ is the fundamental signal of the BAW devices like the $MZO_{nano}$ QCM and the TFBAR, from which the frequency shift and motional resistance are derived. Both frequency shift and motional resistance keep slightly increasing until equilibrium at 40 min. This equilibrium signal will serve as the background signal. Then, P. aeruginosa cells were added to the device. Background signal variations were subtracted from the detection signals during the biosensing process. The frequency shift parameter reports the mass accumulation on the sensing surface of the BAW while the motional resistance reports on the viscoelastic transitions undergone by the biological sample on the sensing surface of the BAW.

Electrical Characteristics of the MZO DGTFT

The transfer characteristics of the MZO DGTFT were firstly tested with its top gate electrode electrically connected to a DC power supply. We chose $V_{TG}$ from 0 to $-1$ V with a step of $-0.2$ V as the setting to demonstrate the highly sensitive signal of the device in response to the voltage alternation on its top gate electrode. Such $V_{TG}$ was chosen because the bacteria tend to donate only a small fraction of their membrane electrons to the supporting substratum, and thus the equivalent top gate bias induced by bacterial adhesion should be negative and small.

Figure 10:
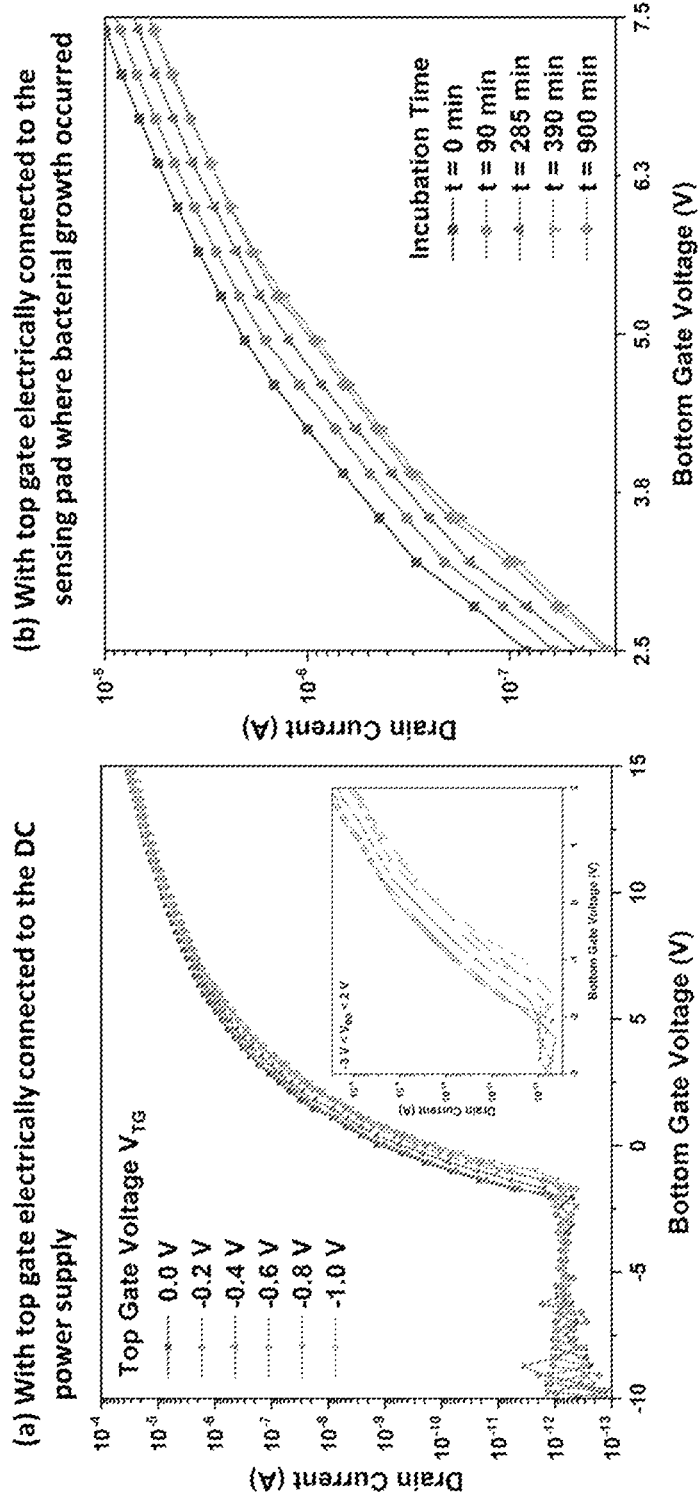
FIG. 10(a) shows the electrical transfer characteristics of an MZO DGTFT with various top gate biases. The inset shows the detailed characteristics with bottom biasing voltage ranging from −3 V to 2 V. The I-V curves keep right shifting with the increasing value of negative top gate bias due to electrostatic field-effect.
FIG. 10(b) shows electrical signal response of the MZO DGTFT biosensor (2.5 V<$V_{BG}$<7.5 V) with its top gate electrically connected to the sensing pad where bacterial growth occurred. Drain current keeps decreasing as the incubation time increasing until t=390 min.

The measurement results are shown in FIG. 10(a). The curve at $V_{TG}=0$ V shows a threshold voltage of 7.47 V, subthreshold slope of 637 mV/dec. The low threshold voltage ensures the device with low power consumption. The steep subthreshold slope enables high sensitivity of the device owing to the high electrical signal gain of the device. To have a closer look at the variations of the I-V curves due to different top gate biases, the inset figure in FIG. 10(a) shows the detailed characteristics in the range of $-3$ V<$V_{BG}$<2 V where the device is just about to be turned on. It could be clearly seen that these transfer curves exhibit parallel right shifts with respect to the increasing values of $V_{TG}$. The threshold voltage $V_{TH}$ positively shifts ~10% from 7.47 V at $V_{TG}=0$ V to 8.25 V at $V_{TG}=-1$ V.

MZO is a kind of n-type semiconductor material. The bottom gate bias introduces a vertical electrical field that accumulates electrons at the bottom channel/dielectric interface. To compensate the depletion and turn on the device, the threshold voltage must be adjusted by an equivalent positive shift.

The right shifting of threshold voltage also lowers the drain current under a certain bottom gate biasing condition, especially in the triode region of the transfer characteristics. For example, the drain current at $V_{BG}=0$ decreases nearly one decade from $1.37\times10^{-9}$ A at $V_{TG}=0$ to $1.41\times10^{-10}$ A at $V_{TG}=-1$ V (shown in the inset of FIG. 10(a)). The steep slope in the triode region of the transfer characteristics results in large current variations within a small range of bottom gate biases, and hence provides high current amplification when the top gate bias varies. Comparing to the threshold voltage change, the drain current change of DGTFT is particularly favorable for using as the signal to represent the early stage development of biofilm formation and is used to define the sensitivity of the biosensor.

The high electrical sensitivity of the device enables the DGTFT to detect the early stage of biofilm formation. Next, the MZO DGTFT biosensor was then used to detect the onset of P. aeruginosa biofilm formation with its top gate electrode electrically connected to the sensing pad where bacterial growth occurs. Three $MZO_{nano}$ modified sensing pads were prepared The detection of P. aeruginosa biofilms was performed on each of these pads using the same DGTFT device under the same microbial culture and measurement conditions. The sensing pad was immersed in MHB medium and was allowed its baseline signal to stabilize before the P. aeruginosa culture solution was introduced at time t=0. The measurements of transfer characteristics were made sequentially for a total of 900 min of incubation time.

In obtaining the signal that represents the status of early stage biofilm development, we've described how to balance between sensitivity and stable operations when choosing the best point of operation in Example 1. Using similar method, $V_{BG}=5$ V is determined as the optimum operation point in this study. For better visualization, part of the transfer characteristics (2.5 V<$V_{BG}$<7.5 V) of a single set of measurements are shown in FIG. 10(b). As can be clearly seen from the figure, the drain current keeps dropping until t=390 min where it exhibits no significant variation comparing with the one at t=900 min. DGTFT is a highly sensitive electrical device. Drain current drops as a result of the negative bias applied on its top gate electrode. In the biosensing experiment, the current change is attributed to the electron charge transfer resulted from the bacterial adhesion to the $MZO_{nano}$ surface during the early stage development of the biofilm formation.

The testing results shows no significant signal variation after t=390 min, indicating limited long-term monitoring capability of the device. Thus, the biofilm development process beyond the early stage is essentially difficult to detect using this MZO DGTFT biosensor. This promoted us to employ the $MZO_{nano}$ QCM for monitoring the long-term biological evolutions of biofilm formation to complement MZO DGTFT for monitoring the later stages of biofilm formation.

Full-Scale Dynamic Monitoring of Biofilm Development and Formation

In this part, we present the full-scale dynamic monitoring results of the biofilm development and formation. The early stage detection capability of the MZO DGTFT biosensor is discussed in Example 1. Owing to the high electrical signal gain provided by the active device, its drain current variations as a result of bacterial charge transfer are utilized as the output signals to realize the early stage detection of biofilm formation. However, our results show that the signal saturates after a certain period. On the other hand, $MZO_{nano}$ QCM is capable of precisely measuring mass accumulation and viscoelastic transition on its surface, and thus provides high sensitivity of monitoring the subsequent stages of biofilm evolution. In the $MZO_{nano}$ QCM as with the TFBAR, the frequency shift parameter reports the mass accumulation on the sensing surface while the motional resistance reports on the viscoelastic transitions undergone by the biological sample on the sensing surface.

To obtain the full-scale dynamic profile of biofilm evolution, both MZO DGTFT and $MZO_{nano}$ QCM biosensors were used to monitor the progress of biofilm development under the same microbial conditions.

Figure 11:
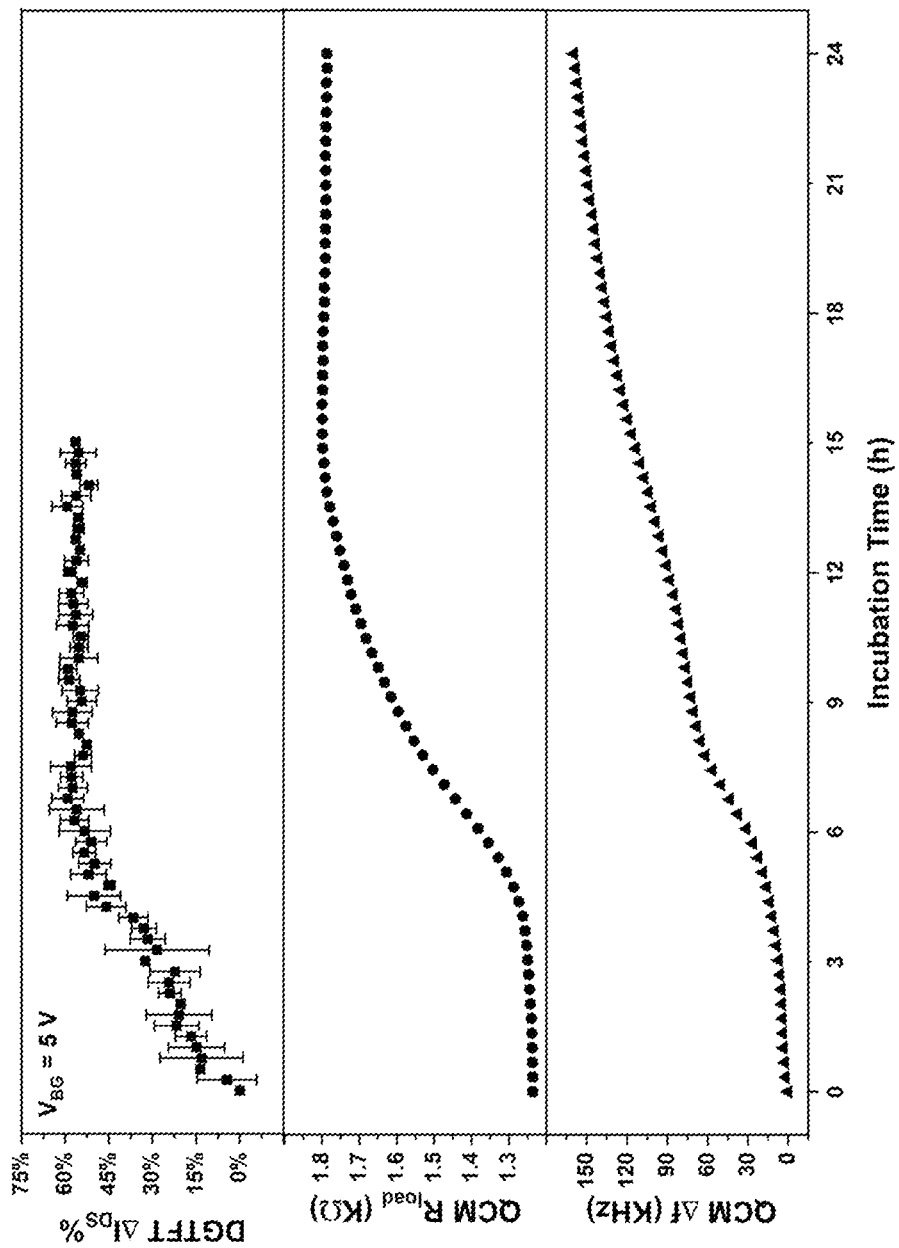
FIG. 11 shows the signal variations during the full-scale development of P. aeruginosa biofilm formation, represented by the percentage changes of drain current of DGTFT, motional resistances and frequency shifts of MZO$_{nano}$ QCM.

The time-evolving signal response of the MZO DGTFT and the $MZO_{nano}$ QCM are plotted in FIG. 11. Percentage change of drain current is used as the signal of the DGTFT biosensor to represent the early stage development of biofilms. Using similar method as mentioned in Example 1, $V_{BG}=5$ V is determined as the optimum operation point. No lag phase is exhibited by the bacterial culture, which can be attributed to having the bacterial culture introduced already in a metabolically active state and does not require time to enter cell division. The percentage change of drain current keeps increasing as incubation time goes from t=0, after which the currents level off at about t=6.5 h (390 min), which signifies the detection point for the onset of biofilm formation. Although the biofilms were still growing and far from maturation at t=6.5 h, as will be shown in the microscopic images, the charge transfer effect between bacterial cell surface and the substratum surface was being gradually prohibited and diminished. The charge transfer only takes place at the interface between bacterial cells and the substrate because the biofilms of P. aeruginosa are poorly conductive. After t=6.5 h, the slope of the current change is approaching zero and the signal eventually becomes independent of time. Signal of the DGTFT here demonstrates a maximum current change of 57% with an average standard deviation of 5.1%. Such early stage detection could alert medical professionals to treat the biofilms in a timely manner.

The $MZO_{nano}$ QCM's resonance frequency shift $\Delta f$ and the motional resistance Road are also plotted in FIG. 11 with the same time axis as the DGTFT's results. The average standard deviations of $\Delta f$ and $R_{load}$ are 2.47 KHz and 11.68$\Omega$, respectively (They are too small to be shown in the figure scale). As shown in the figure, the QCM barely detects the early stage, especially before t=5 h. The small mass and viscoelastic transition the sensor can detect limit its sensitivity for the early stage biofilm monitoring. The MZO DGTFT biosensor, however, already exhibits 52% drain current reduction at t=5 h when $V_{BG}$=5 V. Large increment in the QCM signal values starts to be observed after t=5 h. The $R_{load}$ plot shows a rapid growth phase from t=5 h to 15 h, but the signal stops increasing and saturates at about 15 h with a maximum change of $\Delta R_{load}$=560$\Omega$. The motional resistance saturation indicates that the viscosity of the biofilms reaches its peak value although the biofilms are still increasing in mass as shown in the frequency shift data. The frequency shift $\Delta f$ exhibits a steady increase all the way towards to the end of the experiment (t=24 h) and reaches 160 KHz, indicating that the biofilms are still evolving and keep gaining weight during the course of development.

The MZO DGTFT biosensor shows a significant signal variation (52%) in the first 5-hour of biofilm development, but the signal diminishes after the certain period. The $MZO_{nano}$ QCM has difficulties in detecting the initial formation of biofilms but shows the ability of monitoring the long-term later process of biofilm development, which is represented by two important characteristics of $MZO_{nano}$ QCM: frequency shift and motional resistance. The change of both parameters demonstrates the development of biofilms, whereas the saturation of motional resistance corresponds the final biofilm maturation stage as will be shown below.

Microscopy Characterization of Crystal Violet Stained Biofilms

Crystal violet staining assay was used to verify the formation of P. aeruginosa biofilms and traced the process at different times. The $MZO_{nano}$ modified glass substrates were used as the supporting surfaces for biofilm incubation. The same growth conditions were applied as used for biosensing. The optical microscopic images of the biofilm formation process on the $MZO_{nano}$ coated glass substrate were taken at times of t=0, 1.7 h (100 min), 3.3 h (200 min), 5 h (300 min), 8 h, 15 h, and 24 h as shown in FIG. 12.

Figure 12:
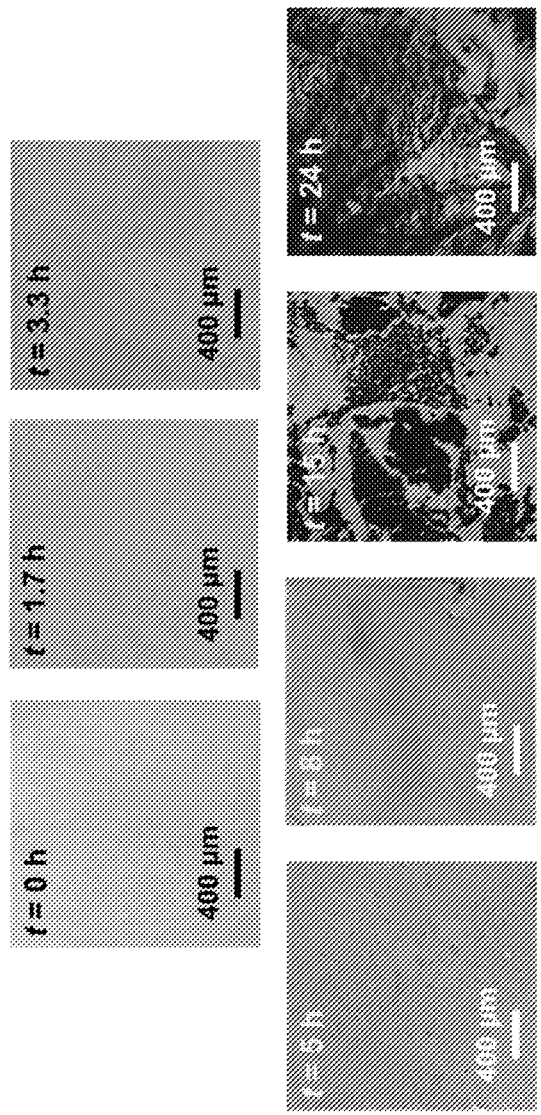
FIG. 12 shows the optical microscopic images of the crystal violet stained P. aeruginosa biofilm formation process on MZO$_{nano}$, recorded at t=0, 100 min, 200 min, 300 min, 8 h, 16 h, and 24 h, respectively.

From the microscopic images in FIG. 12, we can hardly distinguish if there is bacterial adhesion on the sensing pad when t=1.7 h. However, the results of the MZO DGTFT biosensor does show the obvious current reduction of 21% at t=1.7 h, indicating bacterial adhesion. Afterwards, it can be clearly seen that more bacterial microcolonies were formed at the sites of adhesion from t=3.3 to 5 h and the biofilms began to take shape at t=8 h. However, t=8 h is the time point where the DGTFT already exhibits a signal saturation value of 57%. With the increasing of incubation time, the microcolonies shown at t=8 h kept developing and showed darker color when time reached t=15 h. During this time period, DGTFT biosensor does not show signal variation whereas the $MZO_{nano}$ QCM does show obvious change in both the frequency shift and motional resistance. At t=15 h, a set of size and shape of biofilms can be seen now, and biofilms at this stage are referred to as being "mature". This is also the point where the motional resistance signal of $MZO_{nano}$ QCM reaches plateau. Finally, the biofilms covered the majority of the surface (~64%) when t=24 h.

Example 4. A Plug-In-Card Type of Biosensor for the Full-Scale Monitoring of Biofilm Formation To form the plug-in-card type of biosensing pad, $MZO_{nano}$ thin film bulk acoustic wave resonator ($MZO_{nano}$ TFBAR) is used to miniaturize the $MZO_{nano}$ QCM device. An example of $MZO_{nano}$ TFBAR array 300 is shown in FIG. 13(a), where multiple TFBARs 310 are aligned on the same substrate 301. One TFBAR 306 is shown in FIG. 13(b), where the structure features of an TFBAR include: a piezoelectric layer 312 sandwiched between two electrodes; top electrode 313 with a layer of $MZO_{nano}$ 314 that serves as the sensing area. To avoid complex fabrication process, the TFBAR device is constructed on nonconducting substrate, such as glass 301, which results no acoustic loss. Multiple TFBAR devices are fabricated and patterned in an array for high throughput testing, as shown in FIG. 13(a). The nonconducting substrate (glass) electrically isolates these devices.

Figure 14:
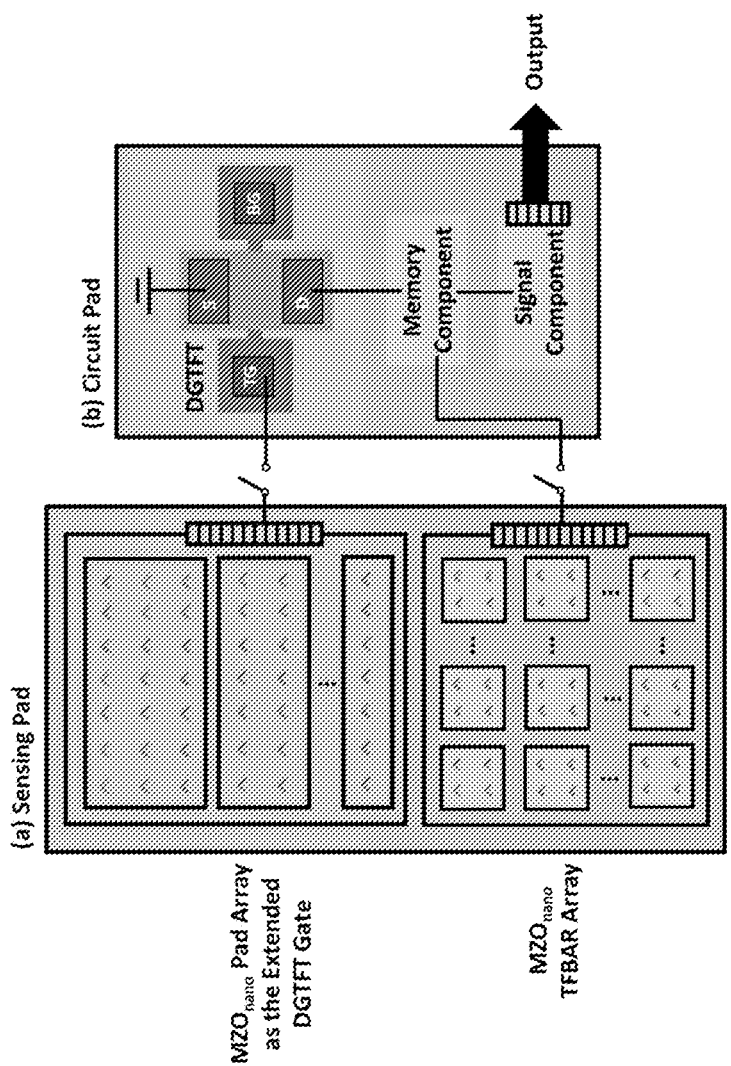
FIG. 14 shows the schematic diagram of a system on chip (SOC) sensing platform for the full-scale monitoring of biofilm evolution. The SOC system uses a plug-in-card type of design consisting of (a) a disposable sensing pad (MZO$_{nano}$ sensing array+MZO$_{nano}$ TFBAR array) and (b) a reusable circuit pad (DGTFT+memory circuit+signal processing circuit).

In the miniaturized embodiment of the device, both the $MZO_{nano}$ TFBAR and the extended $MZO_{nano}$ sensing pad of the MZO DGTFT can be fabricated and integrated in the same glass substrate to form a plug-in-card type of sensing pad because their core component $MZO_{nano}$ structures are the same, and it can be simultaneously deposited on the top electrode of TFBAR and on the extended sensing pad of DGTFT. Such a system on chip (SOC) approach reduces the cost and enhances the throughput; therefore, it is particularly useful for monitoring the full-scale process of bacterial biofilm formation and development under various conditions. The integrated system of biosensors is shown in FIG. 14. It has two separate pads: (a) a sensing pad consisting of an $MZO_{nano}$ sensing array as the DGTFT's extended sensing gate and an $MZO_{nano}$ TFBAR array, and (b) a circuit pad consisting of DGTFT(s), memory component, and data processing component. After processing, the output signal can be connected to a regular display or to a wireless portable platform through a proper interface. The sensing pad of the system is disposable and its circuit pad is reusable, which fuels the realization of a reliable and low-cost biosensor system. Furthermore, a microfluidics system that comprises a sample reservoir and flow channels can be integrated with the sensing pad for feeding the analyte. Such SOC design enables high throughput analysis with high reliability and low-cost property.

It will be appreciated by persons skilled in the art that the biosensor described herein are not limited to what has been particularly shown and described. Rather, the scope of the biosensor is defined by the claims which follow. It should further be understood that the above description is only representative of illustrative examples of embodiments. The description has not attempted to exhaustively enumerate all possible variations. The alternate embodiments may not have been presented for a specific portion of the biosensor, and may result from a different combination of described portions, or that other un-described alternate embodiments may be available for a portion, is not to be considered a disclaimer of those alternate embodiments. It will be appreciated that many of those un-described embodiments are within the literal scope of the following claims, and others are equivalent.

The invention claimed is:

1. A biosensor system for detecting the biofilm formation and development, comprising a dual gate thin-film transistor (DGTFT) biosensor and a bulk acoustic wave (BAW) sensor, where the DGTFT biosensor comprising
(a) a DGTFT transducer, comprising
a first substrate;
a bottom biasing gate deposited on the first substrate;
a bottom dielectric layer deposited on a top surface of the bottom biasing gate;
a channel layer comprising semiconducting $Mg_xZn_{1-x}O$ deposited on a top surface of the bottom dielectric layer, wherein $0<x\leq0.06$;
a top gate dielectric layer deposited on the channel layer;
a top sensing gate deposited on the top gate dielectric layer; and
a drain electrode and a source electrode each electrically connected to the channel layer; and
(b) a sensing pad receptor, comprising
a second substrate;
an electrode layer comprising an array of electrode patterns with different surface areas deposited on the second substrate;
a sensing nanostructure layer deposited and patterned on the array of electrode patterns, wherein the sensing nanostructure layer comprises $Mg_yZn_{1-y}O$, wherein $0\leq y\leq0.1$; and
wherein the sensing pad receptor is electrically connected to the DGTFT transducer;
where the BAW sensor is a nanostructure-modified quartz crystal microbalance (QCM) or thin film bulk acoustic wave resonator (TFBAR);
wherein the nanostructure-modified QCM comprises:
a commercial quartz crystal piezoelectric layer between a first top electrode and a first bottom electrode;
a nanostructure layer comprises $Mg_yZn_{1-y}O$, wherein y is specified as the Mg composition;
wherein the $Mg_yZn_{1-y}O$ of the nanostructure layer and the $Mg_yZn_{1-y}O$ of the sensing nanostructure layer are the same;
wherein the nanostructure-modified TFBAR comprises:
a third substrate;
a second bottom electrode deposited and patterned on the third substrate;
a piezoelectric film;
a second top electrode deposited and patterned on a top surface of the piezoelectrode film;
a $Mg_yZn_{1-y}O$ nanostructure layer deposited and patterned on the top electrode surface of the said the TFBAR, wherein y is as defined above.

2. The biosensor system of claim 1, wherein y of the $Mg_yZn_{1-y}O$ ranges from 0.01 to 0.10 to enlarge the pH endurance range and reduce the zinc-ion induced bio-toxicity.

3. The biosensor system of claim 1, wherein the $Mg_yZn_{1-y}O$ nanostructure layer on the sensing pad, on the QCM top electrode, and on the TFBAR top electrode have a same surface morphology comprising sharp tips, rough surfaces, or both to enhance the bacterial bonding efficiency.

4. The biosensor system of claim 1, wherein the $Mg_yZn_{1-y}O$ nanostructure layer on the sensing pad, the $Mg_yZn_{1-y}O$ nanostructure layer on the QCM top electrode, and the $Mg_yZn_{1-y}O$ nanostructure layer on the TFBAR top electrode have a hydrophilic surface to enhance the bacterial bonding efficiency and to reduce the bio-solution consumption.

5. The biosensor system of claim 1, wherein the DGTFT transducer has a $Mg_xZn_{1-x}O$ channel layer wherein the x value is in the range $0<x\leq0.06$ and the channel layer has a thickness ranging from about 20 nm to about 100 nm.

6. The biosensor system of claim 1, wherein the DGTFT transducer further comprising a diffusion barrier layer comprising MgO at interface between the channel layer and the top gate dielectric layer and/or between the channel layer and the bottom dielectric layer.

7. The biosensor system of claim 1, wherein the bottom electrode layer of the sensing pad receptor is electrically connected to the top sensing gate of DGTFT transducer, wherein the sensing pad receptable is disposable and replaceable.

8. The biosensor system of claim 1, wherein the piezoelectric film of the TFBAR comprises Ni-doped or Cu-doped ZnO or MZO.

9. The biosensor system of claim 1, wherein the DGTFT sensing pad receptor and the TFBAR sensor are integrated on a same nonconducting substrate.

10. The biosensor system of claim 1, wherein the BAW sensor comprises a plurality of the TFBAR in an array, wherein the array is fabricated on a same nonconducting substrate as the sensing pad receptor.

11. The biosensor system of claim 1, wherein the sensing pad receptor and the TFBAR are integrated into a same disposable or replaceable sensing pad, and the DGTFT transducer is integrated in a separate circuit pad, wherein the sensing pad and the circuit pad are conductively connected.

12. A kit comprising the biosensor system of claim 1.

13. The kit of claim 12, further comprising an incubator for incubating a sample to be detected.

14. A method of detecting various stages of biofl1m from early formation to mature in a sample, comprising contacting the sample with the $Mg_yZn_{1-y}O$ nanostructure layer deposited on the sensing pad and/or on top electrode of BAW sensor of claim 1, wherein the early-stage formation of biofilm is detected at the DGTFT biosensor via electrical signal extraction and subsequent stage of the biofilm development and maturation are detected at the BAW biosensor layer via acoustic signal extraction.

15. The method of claim 14, wherein the electrical signal extraction comprises
(i) transferring electrical charges from the sensing pad receptor to the top sensing gate of the biosensor of claim 1, wherein the electrical charges serve as equivalent biasing on a top electrode of the top sensing gate, and
(ii) detecting changes produced by the biasing in drain current.

16. The method of claim 15, further comprising setting a biasing voltage ranging from −20 V to 20 V for the bottom biasing gate of DGTFT biosensor of claim 1 so that operation region of the DGTFT transducer is in triode region.

17. The method of claim 16, further comprising adjusting the DGTFT biasing voltage to obtain a trade-off between signal variations and operation stability.

18. The method of claim 15, further comprising processing first-order derivative of drain current variation as a function of incubation time, indicative of a change in rate of charge transfer.

19. The method of claim 14, further comprising processing motional impedance and frequency shift signals of the BAW sensor indicative of viscoelastic transitions and mass accumulation during bacterial adhesion, bacterial expansion stage and/or biofilm maturation stage.

20. The methods of claim 14, which is for detecting the biofilm formation of a bacteria selected from the group consisting of *Candida spp., Hormoconis spp., Pseudomonas spp., Pseudo-alteromonas spp., Staphylococcus spp., Streptococcus spp., Shigella spp., Mycobacterium spp., Enterococcus spp., Escherichia spp., Salmonella spp., Legionella spp., Haemophilus spp., Bacillus spp., Desulfovibrio spp., Shewanella spp., Geobacter spp., Klebsiella spp., Proteus spp., Aeromonas spp., Arthrobacter spp., Micrococcus spp., Serratia spp., Porphyromonas spp., Fusobacterium spp., Vibrio spp., Candida albicans, Pseudomonas aeruginosa, Staphylococcus epidermidis, Escherichia coli, Bacillus licheniformis, Serratia marcescens, Fusobacterium nucleatum*, and *Vibrio Cholerae*.

* * * * *

UNITED STATES PATENT AND TRADEMARK OFFICE
CERTIFICATE OF CORRECTION

| | | |
|---|---|---|
| PATENT NO. | : 12,270,778 B2 | Page 1 of 1 |
| APPLICATION NO. | : 17/247838 | |
| DATED | : April 8, 2025 | |
| INVENTOR(S) | : Yicheng Lu et al. | |

It is certified that error appears in the above-identified patent and that said Letters Patent is hereby corrected as shown below:

In the Claims

At Column 26, Claim 14, Line number 46, correct the word "biof11m" as follows:
--biofilm--

Signed and Sealed this
Twenty-seventh Day of May, 2025

Coke Morgan Stewart
*Acting Director of the United States Patent and Trademark Office*